(12) United States Patent  
Haran et al.

(10) Patent No.: US 8,617,961 B1
(45) Date of Patent: Dec. 31, 2013

(54) POST-GATE ISOLATION AREA FORMATION FOR FIN FIELD EFFECT TRANSISTOR DEVICE

(75) Inventors: Balasubramanian S. Haran, Watervliet, NY (US); Sanjay Mehta, Niskayuna, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/551,659

(22) Filed: Jul. 18, 2012

(51) Int. Cl.
*H01L 21/76* (2006.01)

(52) U.S. Cl.
USPC ............ 438/404; 438/197; 438/257; 438/268

(58) Field of Classification Search
USPC ................... 438/257, 404, 268, 197
See application file for complete search history.

(56) References Cited

U.S. PATENT DOCUMENTS

| | | | |
|---|---|---|---|
| 6,765,303 B1 * | 7/2004 | Krivokapic et al. | 257/347 |
| 6,770,516 B2 | 8/2004 | Wu et al. | |
| 6,885,055 B2 * | 4/2005 | Lee | 257/308 |
| 6,974,729 B2 | 12/2005 | Collaert et al. | |
| 7,087,532 B2 | 8/2006 | Dobuzinsky et al. | |
| 7,300,837 B2 | 11/2007 | Chen et al. | |
| 7,456,481 B2 | 11/2008 | Inaba et al. | |
| 7,772,048 B2 | 8/2010 | Jones et al. | |
| 7,919,364 B2 | 4/2011 | Sonsky et al. | |
| 2005/0077553 A1 * | 4/2005 | Kim et al. | 257/288 |
| 2005/0170593 A1 * | 8/2005 | Kang et al. | 438/296 |
| 2005/0227435 A1 * | 10/2005 | Oh et al. | 438/257 |
| 2006/0081895 A1 * | 4/2006 | Lee et al. | 257/288 |
| 2006/0141706 A1 * | 6/2006 | Hong | 438/257 |

OTHER PUBLICATIONS

M. Nawaz, et al.,"Full 3D Process and Device Simulation for FinFET Optimization," IEEE; pp. 1-2; 2005.
T. Yamashita, et al.,"Sub-25nm FinFET with Advanced Fin Formation and Short Channel Effect Engineering," Symposium on VLSI Technology Digest of Technical Papers; pp. 14-15; 2011.

* cited by examiner

*Primary Examiner* — Jarrett Stark
*Assistant Examiner* — John M Parker
(74) *Attorney, Agent, or Firm* — Cantor Colburn LLP; Matthew Zehrer

(57) ABSTRACT

A method for fin field effect transistor (finFET) device formation includes forming a plurality of fins on a substrate; forming a gate region over the plurality of fins; and forming isolation areas for the finFET device after formation of the gate region, wherein forming the isolation areas for the finFET device comprises performing one of oxidation or removal of a subset of the plurality of fins.

20 Claims, 32 Drawing Sheets

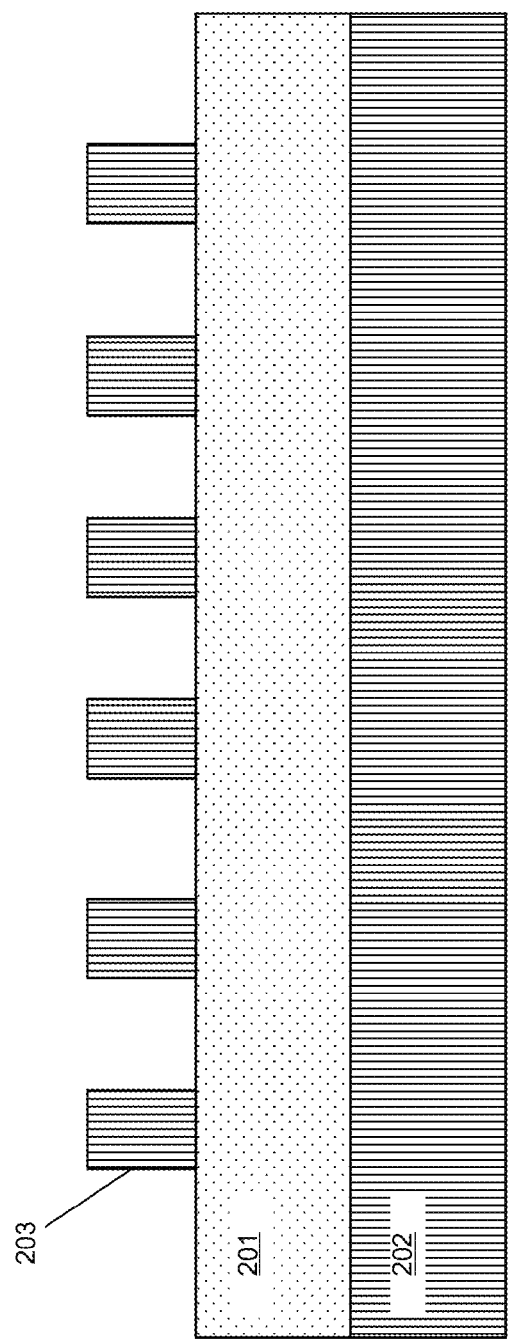

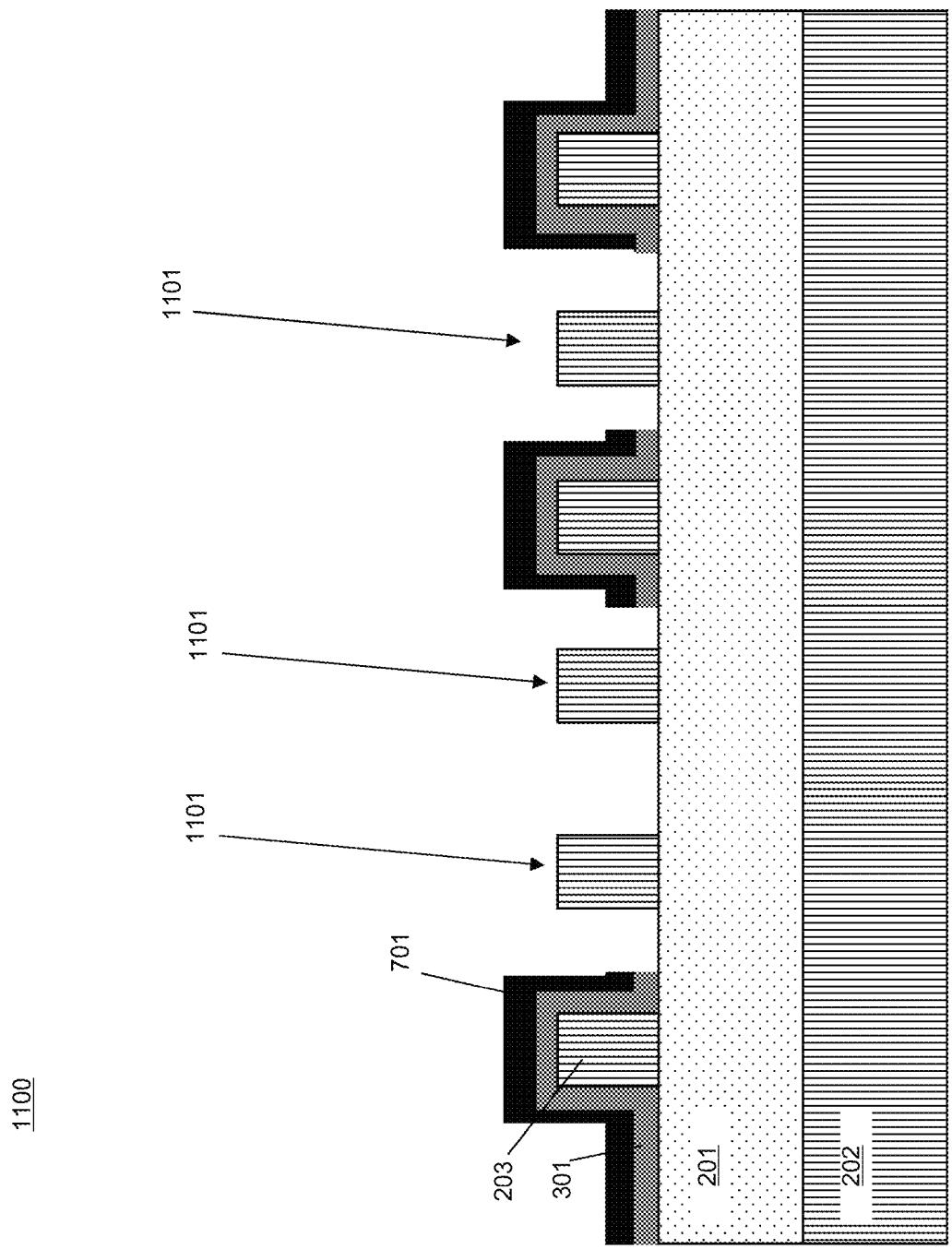

US 8,617,961 B1

POST-GATE ISOLATION AREA FORMATION FOR FIN FIELD EFFECT TRANSISTOR DEVICE

BACKGROUND

This disclosure relates generally to the field of semiconductor device fabrication, and more particular to fin field effect transistor (FinFET) fabrication.

Integrated circuits may comprise various semiconductor devices, including fin field effect transistors (finFETs). FinFETs are devices comprising three-dimensional layers of silicon, referred to as fins, that act as active channel regions, with gate regions located over the fins. FinFETs may be relatively small, high-performance devices. During formation of a finFET device, a plurality of fins may be formed on a substrate, and portions of these fins may be subsequently removed, or cut, to form isolation areas between the finFET devices. The gate regions are then formed over the remaining active fins after the isolation areas are formed. However, fin removal prior to gate formation may cause topography variations in the finFET device, which may lead to problems during subsequent processing steps, such as height differences between gates across the device, which may cause problems during contact formation. To reduce such topography variations, the fins in the isolation areas may alternatively be left in place and oxidized, while the active fins are protected by, for example, a nitride hardmask. However, oxidation of silicon causes an increase in volume in the oxidized fins versus the unoxidized, active fins. Additionally, the nitride hardmask that protects the active fins during oxidation may become more difficult to remove after being exposed to the oxidation, such that the etch that may be required to remove the oxidized nitride hardmask in order to complete processing of the active fins may also remove the oxidized fins. Therefore, fin oxidation may also cause topology variations in the finFET device, leading to similar issues during subsequent processing steps.

BRIEF SUMMARY

In one aspect, a method for fin field effect transistor (finFET) device formation includes forming a plurality of fins on a substrate; forming a gate region over the plurality of fins; and forming isolation areas for the finFET device after formation of the gate region, wherein forming the isolation areas for the finFET device comprises performing one of oxidation or removal of a subset of the plurality of fins.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIGS. 2A-B are schematic block diagrams respectively illustrating a cross-section and a top view of an embodiment of a silicon-on-insulator (SOI) substrate after fin formation.

FIGS. 11A-C are schematic block diagrams respectively illustrating a cross-sections and a top view of an embodiment of the device of FIGS. 10A-B after removal the dielectric layer in the isolation areas.

DETAILED DESCRIPTION

Embodiments of a method for post-gate isolation area formation for a finFET device, and a finFET device with isolation areas that are formed post-gate, are provided, with exemplary embodiments being discussed below in detail. The topology variations in a finFET device may be reduced by formation of the isolation areas after formation of the finFET gate regions. This delay in the formation of the isolation areas provides a uniform topology during gate formation. The isolation areas may be formed by fin oxidation or fin removal in various embodiments. The gate regions that are formed prior to the isolation areas may comprise dummy gates (for a gate last process) or final gates (for a gate-first process) in various embodiments. Fin oxidation and fin removal may be used in conjunction with either a gate-first or gate-last process. Source and drain regions for the finFET device are formed after the isolation areas, and, in embodiments comprising a gate-last process, replacement gate processing of the dummy gates to form final gates is also performed after the formation of the isolation areas.

Figure 1:
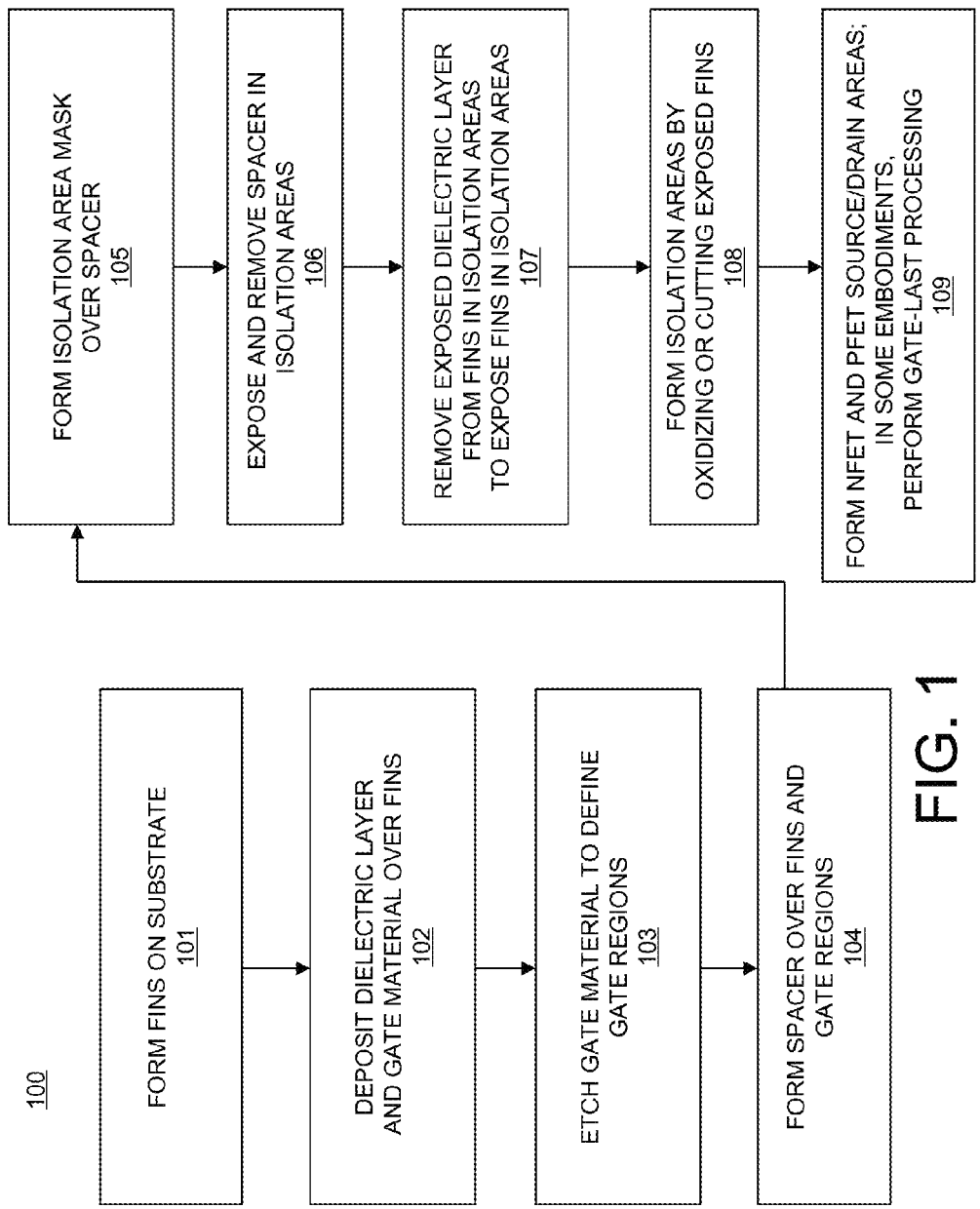
FIG. 1 illustrates an embodiment of a method for post-gate isolation area formation for a finFET device.
Figure 2B:
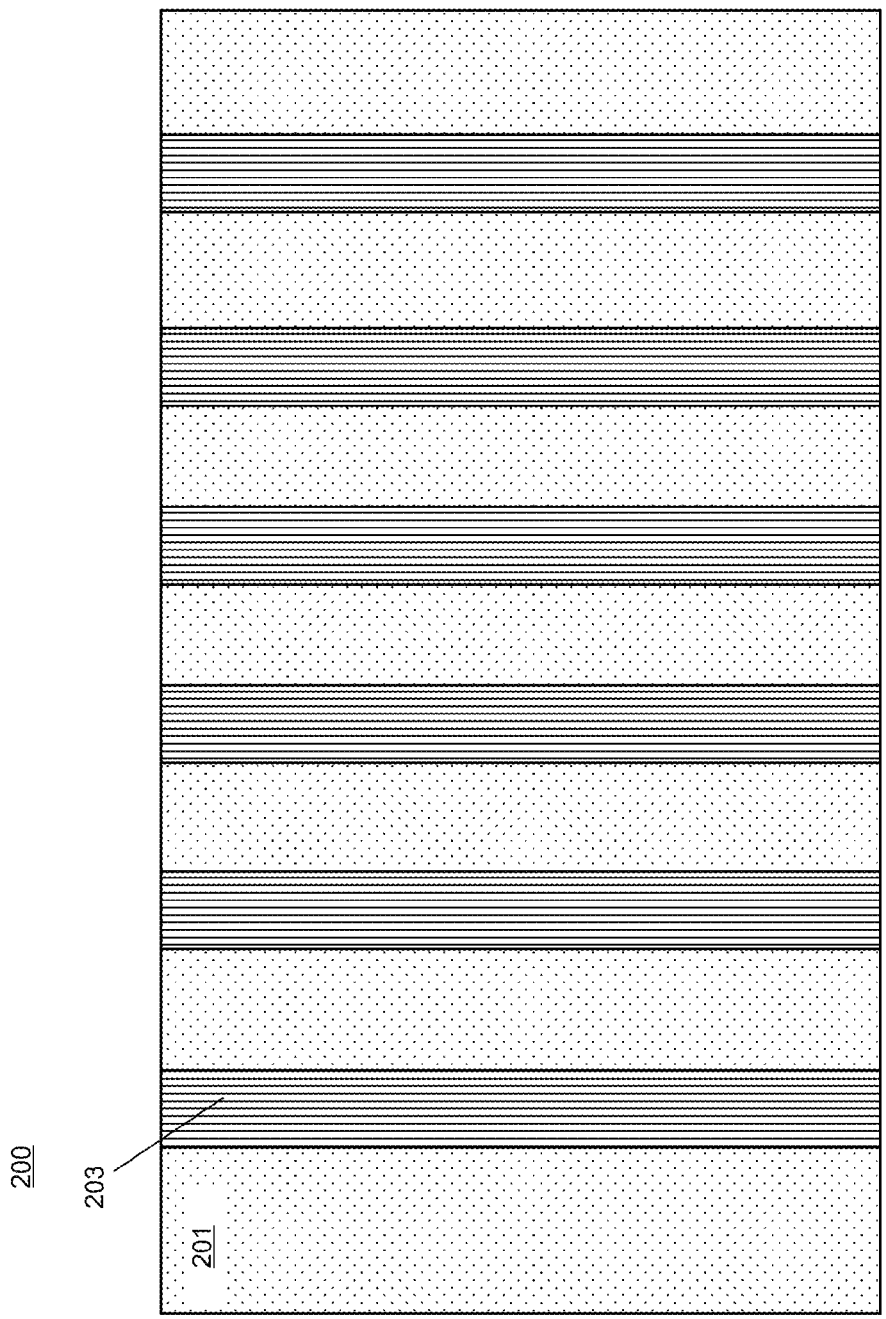

FIG. 1 illustrates an embodiment of a method 100 for post-gate isolation area formation for a finFET device. FIG. 1 is discussed with respect to FIGS. 2A-B to FIGS. 13A-B. First, in block 101 of FIG. 1, a plurality of fins is formed on an SOI substrate. The SOI substrate may comprise a bottom bulk substrate layer, which may comprise silicon, underneath a middle insulator layer, which may comprise buried oxide (BOX), with a relatively thin semiconductor layer, which may comprise silicon, located on top. The fins may be formed in the top semiconductor layer in any appropriate manner, including but not limited to sidewall image transfer. Any appropriate number and orientation of fins may be formed on the SOI substrate during block 101 of FIG. 1. FIGS. 2A-B illustrate a cross-section and a top view of an embodiment of a device 200 comprising a SOI substrate after fin formation. Device 200 includes an SOI substrate including bottom substrate 201, BOX 202, and a plurality of fins 203 located on top of the BOX 202. The fins 203 may comprise silicon fins. FIG. 2 is shown for illustrative purposes only; any appropriate number and orientation of fins may be formed during block 101 of FIG. 1.

Figure 3A:
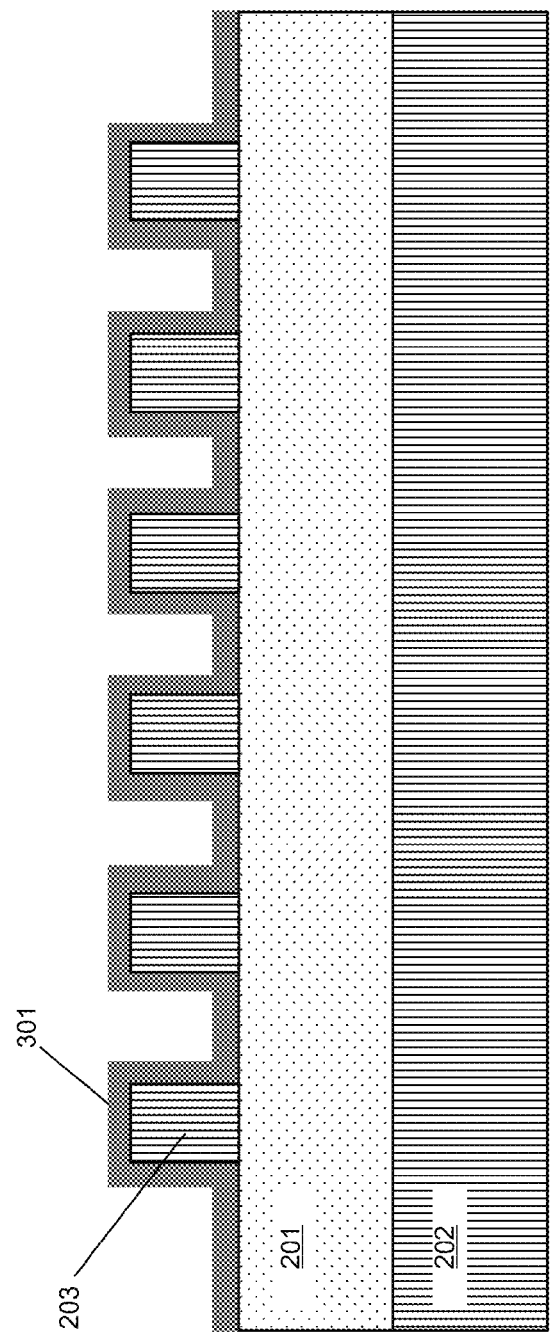
FIGS. 3A-B are schematic block diagrams respectively illustrating a cross-section and a top view of an embodiment of the device of FIGS. 2A-B after formation of a dielectric layer over the device.
Figure 3B:
Figure 4A:
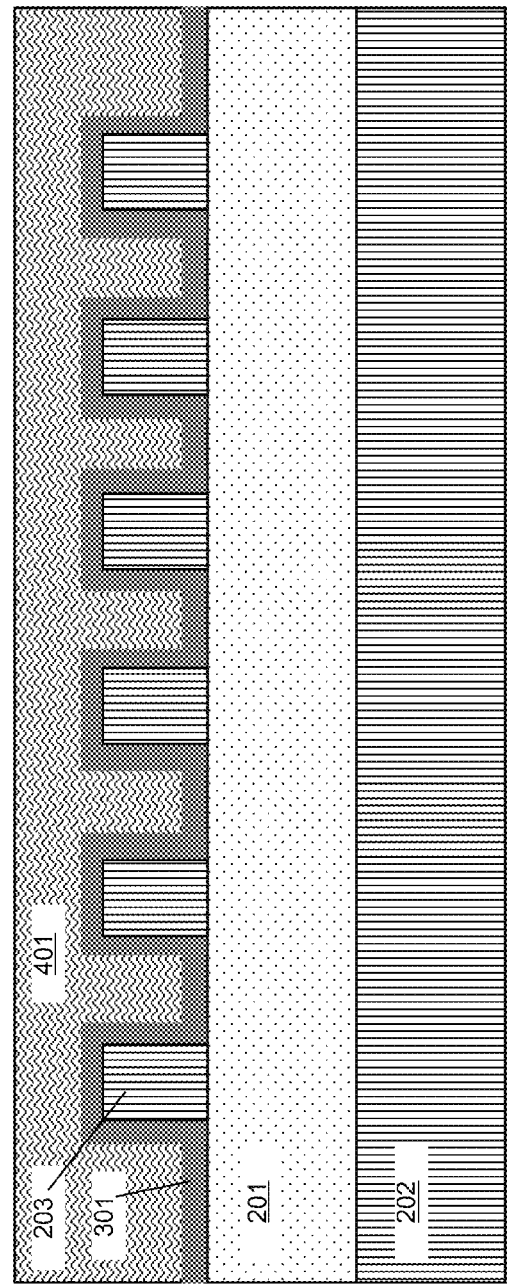
FIGS. 4A-B are schematic block diagrams respectively illustrating a cross-section and a top view of an embodiment of the device of FIGS. 3A-B after formation of gate material over the dielectric layer.
Figure 4B:
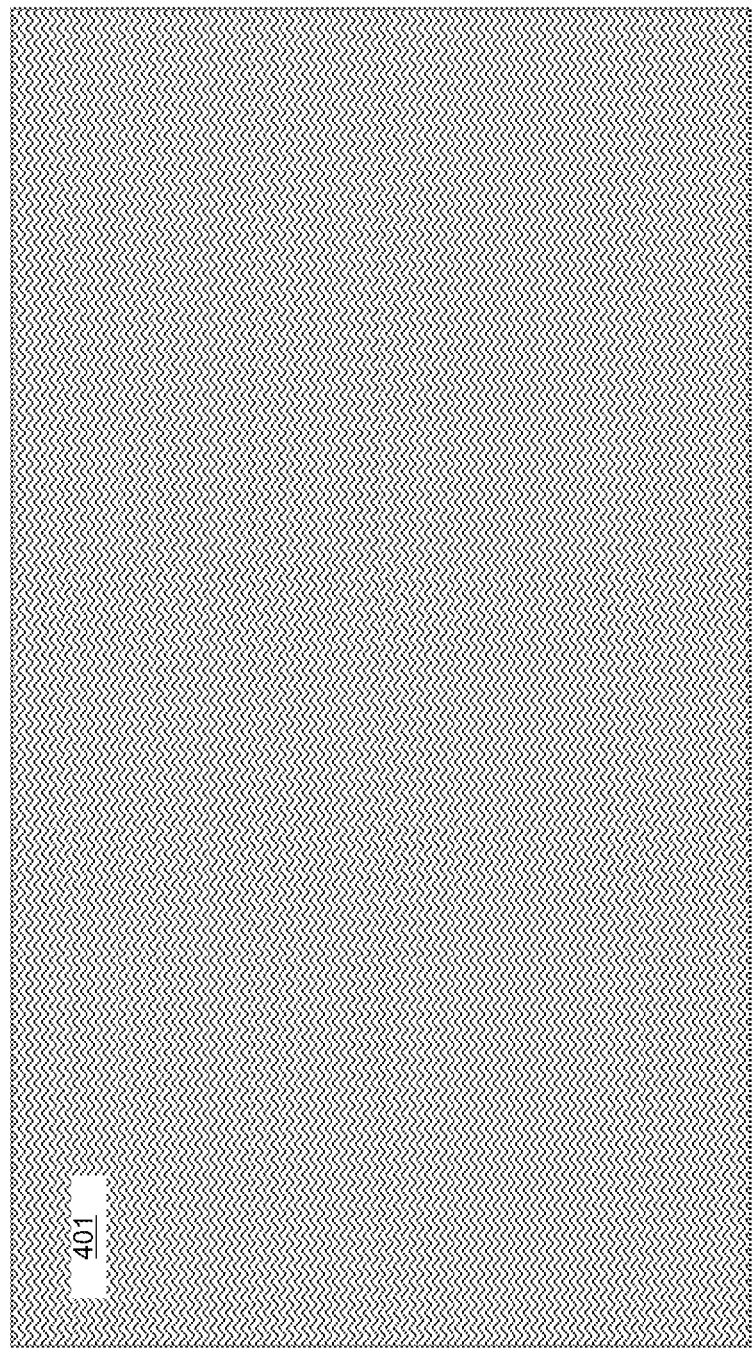

Flow of method 100 of FIG. 1 now proceeds to block 102, in which a dielectric layer and gate material are deposited over the fins. The first dielectric layer may only be deposited in embodiments that comprise a gate-first process, and may comprise a high-k (HK) material and/or oxide in various embodiments. The dielectric layer may be deposited by conformal atomic layer deposition (ALD) in some embodiments. The dielectric layer may comprise a gate dielectric for the finished devices in some embodiments. After the dielectric layer is deposited over the device, gate material is deposited over the dielectric layer. In some embodiments, the gate material may comprise dummy gate material (for a gate last process), while in other embodiments, the gate material may comprise final gate material (for a gate first process). In embodiments in which the gate material comprises dummy gate material, the gate material may comprise polysilicon. In embodiments in which the gate material comprises final gate material, the gate material may comprise a work function metal layer on top of the gate oxide dielectric layer, and silicon layer, which may comprise amorphous silicon, on top of the metal layer. After formation, the top surface of the gate material may be planarized by, for example, chemical mechanical polishing (CMP), to reduce topographical variation in the device. FIGS. 3A-B illustrate a cross-section and a top view of the device 200 of FIGS. 2A-B after formation of dielectric layer 301 over the device 200. Dielectric layer 301 may comprise a high-k (HK) material or oxide in various embodiments, and may be deposited by conformal ALD. FIGS. 4A-B show the device 300 of FIGS. 3A-B after formation and planarization of gate material 401 over the dielectric layer 301. Gate material 401 may comprise polysilicon in some embodiments, or a metal layer underneath a polysilicon layer in other embodiments. The top surface of gate material 401 is planarized by, for example, CMP.

Figure 5A:
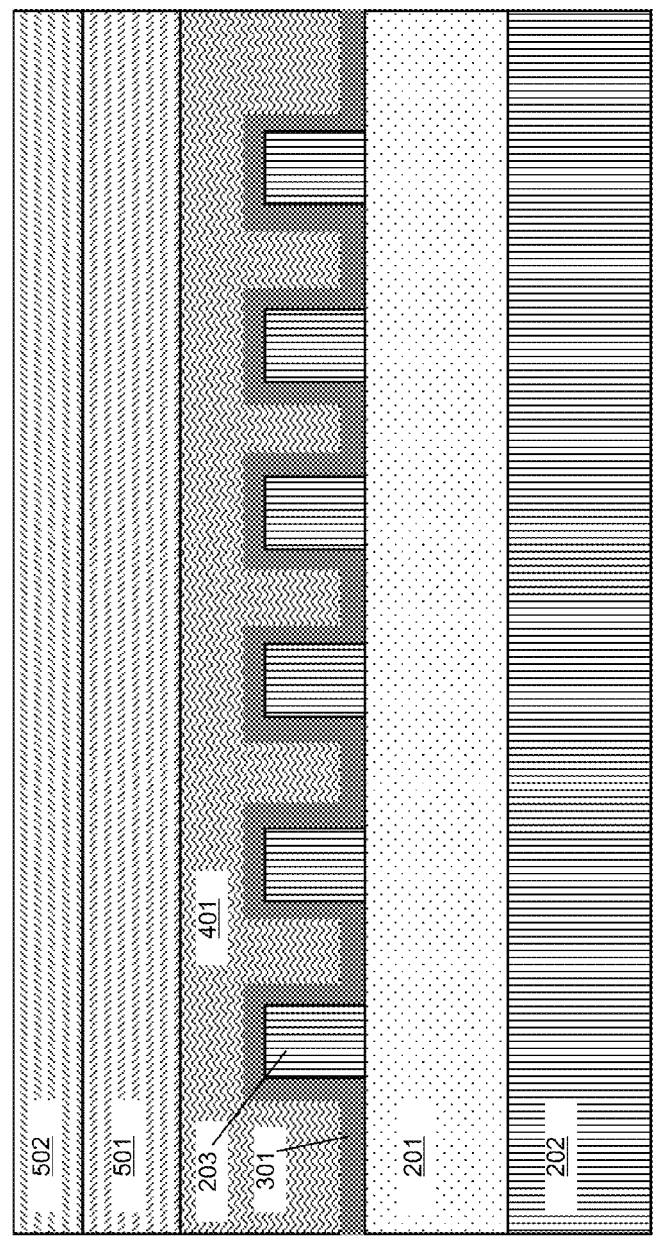
FIGS. 5A-B are schematic block diagrams respectively illustrating a cross-section and a top view of an embodiment of the device of FIGS. 4A-B after formation of a mask layer over the gate material.
Figure 5B:
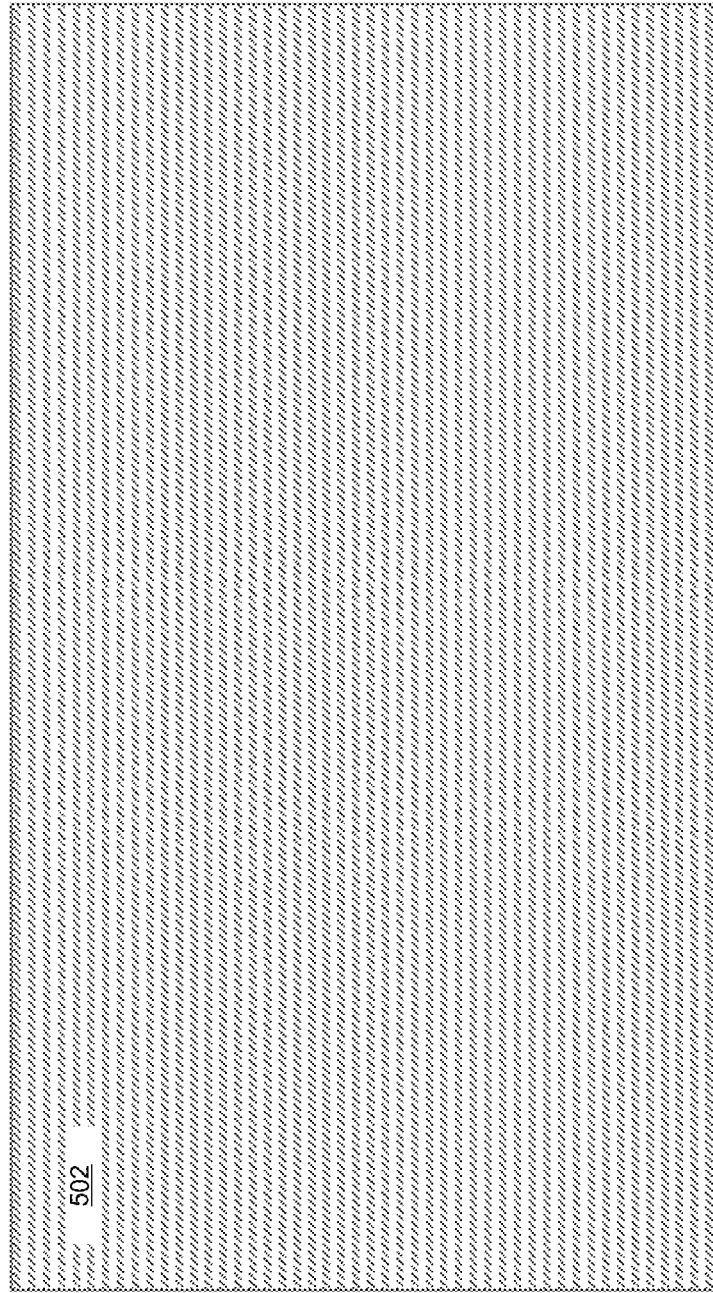
Figure 6A:
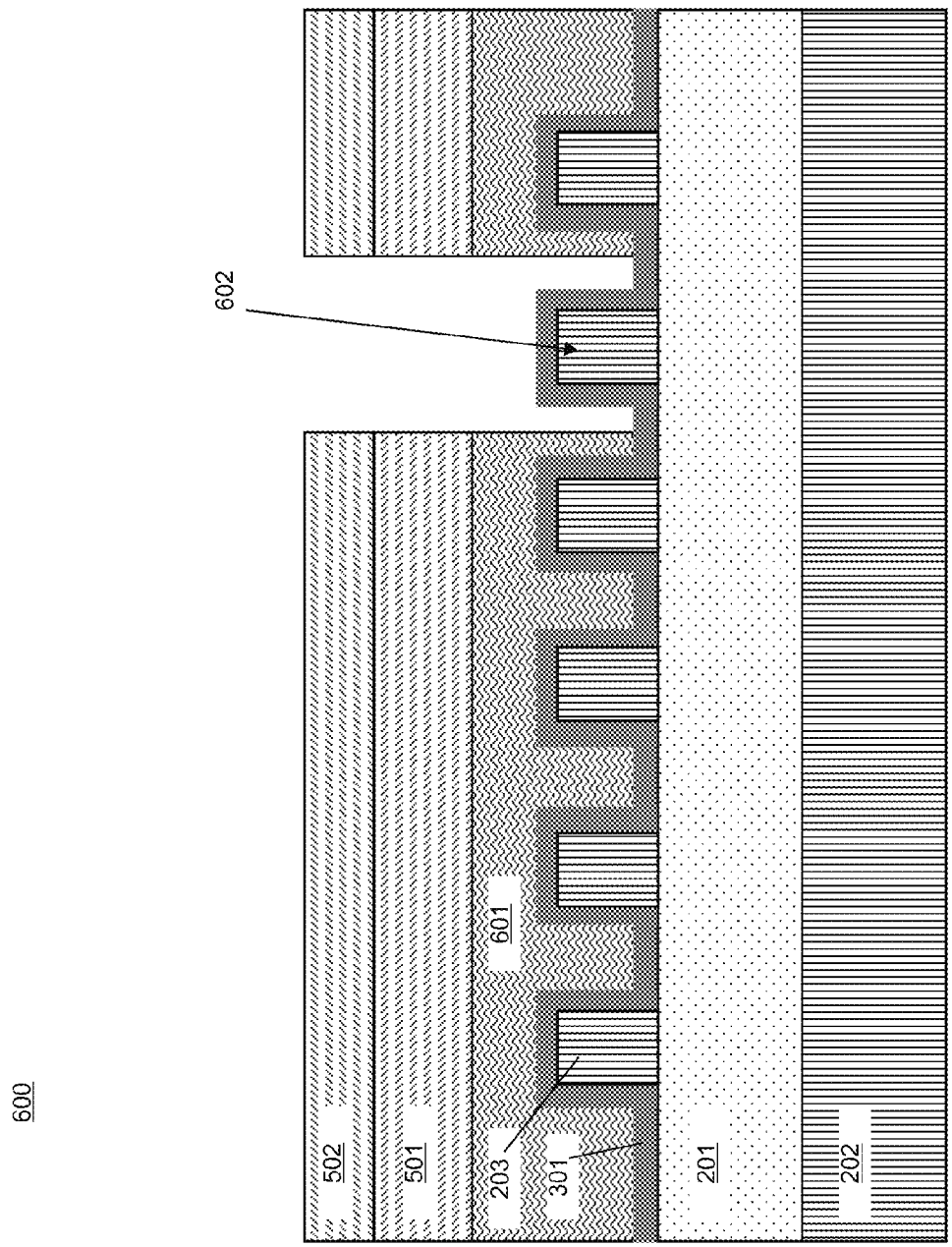
FIGS. 6A-B are schematic block diagrams respectively illustrating a cross-section and a top view of an embodiment of the device of FIGS. 5A-B after gate region definition.
Figure 6B:
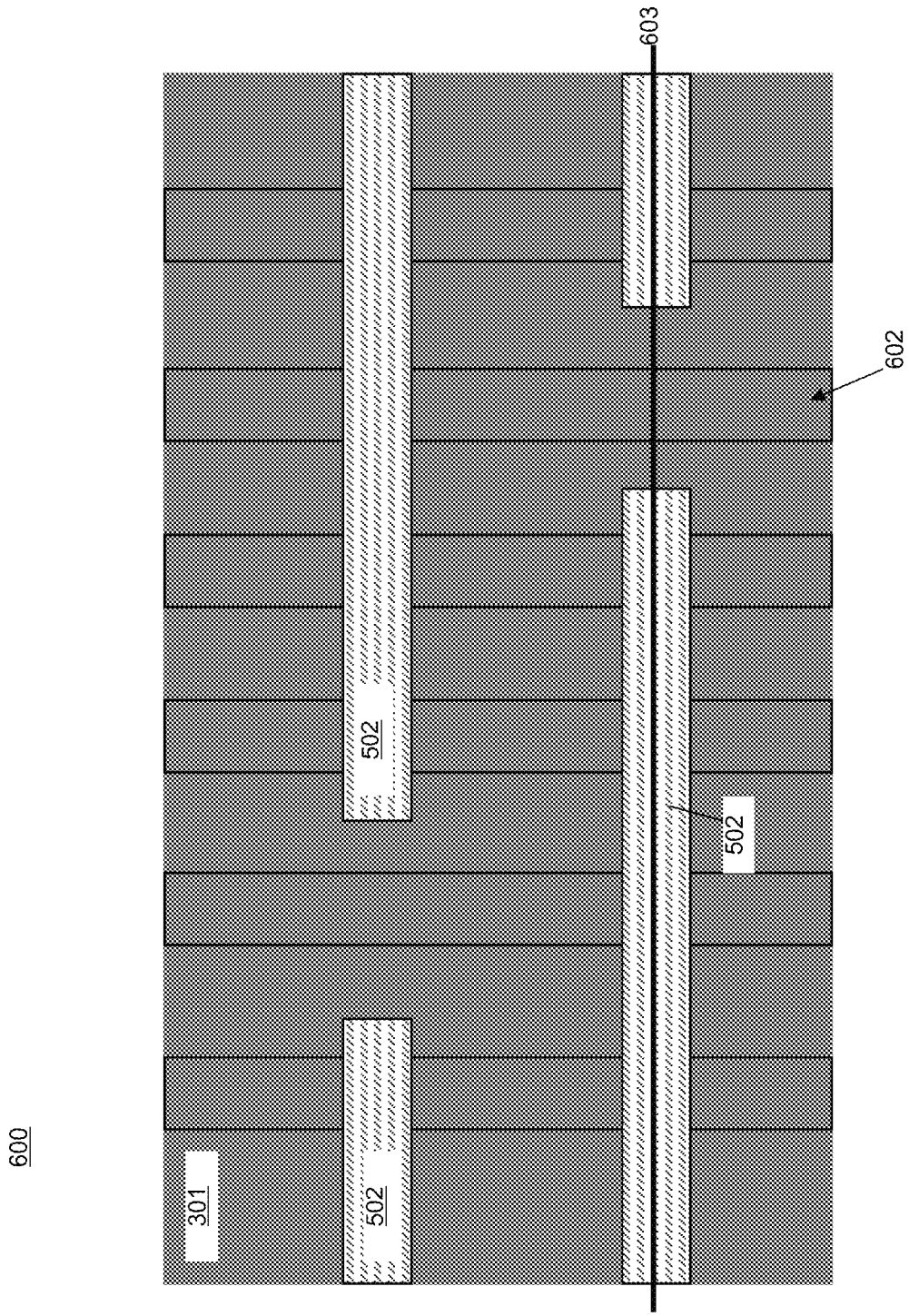

Returning to method 100 of FIG. 1, flow now proceeds to block 103, in which the gate material is etched to define gate regions for the device. Etching of the gate material to define the gate regions may be performed in any appropriate manner, depending on the type of material that comprises the gate material that comprises the gate regions. A two-layer mask comprising a bottom mask layer underneath a top hardmask layer may be formed over the gate material prior to etching the gate material to form the gate regions in some embodiments. The bottom mask layer may comprise nitride in some embodiments, and the top hardmask layer may comprise nitride or oxide in some embodiments. The thickness of the top hardmask layer may be adjusted based on the material used for the top hardmask layer. For example, a nitride top hardmask layer may be relatively thick as compared to an oxide top hardmask layer, so that the nitride top hardmask layer is not fully removed during etching of the nitride spacer 701 (discussed below with respect to block 106 of FIG. 1). The bottom mask layer may also be relatively thick, so as to protect the gate regions during subsequent processing steps, which may include multiple RIE steps. The gate regions may comprise dummy gates or final gates in various embodiments. In embodiments in which the gate regions comprise final gates, the metal and silicon layers may require separate etching steps to define the gate regions. The gate regions may have any appropriate topology with respect to the fins; for example, the gate regions may be oriented perpendicularly to the fins. Because the gate regions are formed over the fins before the isolation areas, the fins provide a uniform topology during gate formation. FIGS. 5A-B illustrate a cross-section and a top view of the device 400 of FIGS. 4A-B after formation of gate mask layers 501/502 over the gate material 401. The bottom mask layer 501 may comprise nitride in some embodiments, and top hardmask layer 502 may comprise an oxide or nitride hardmask in various embodiments. FIGS. 6A-B show the device 500 of FIGS. 5A-B after definition of the gate regions 601. Gate mask layers 501/502 are located on top of the gate regions 601. The cross-section shown in FIG. 6A is along line 603 as is shown in FIG. 6B, which goes through one of the gate regions that is underneath top hardmask layer 502. The gate regions 601 comprise the gate material 401. The gate regions 601 may comprise dummy gates or final gates in various embodiments. The dielectric layer 301, which is located directly on the fins 203, is exposed by formation of the gate regions 601. Fin 602 of fins 203 is exposed in the cross sectional view of FIG. 6A.

Figure 7A:
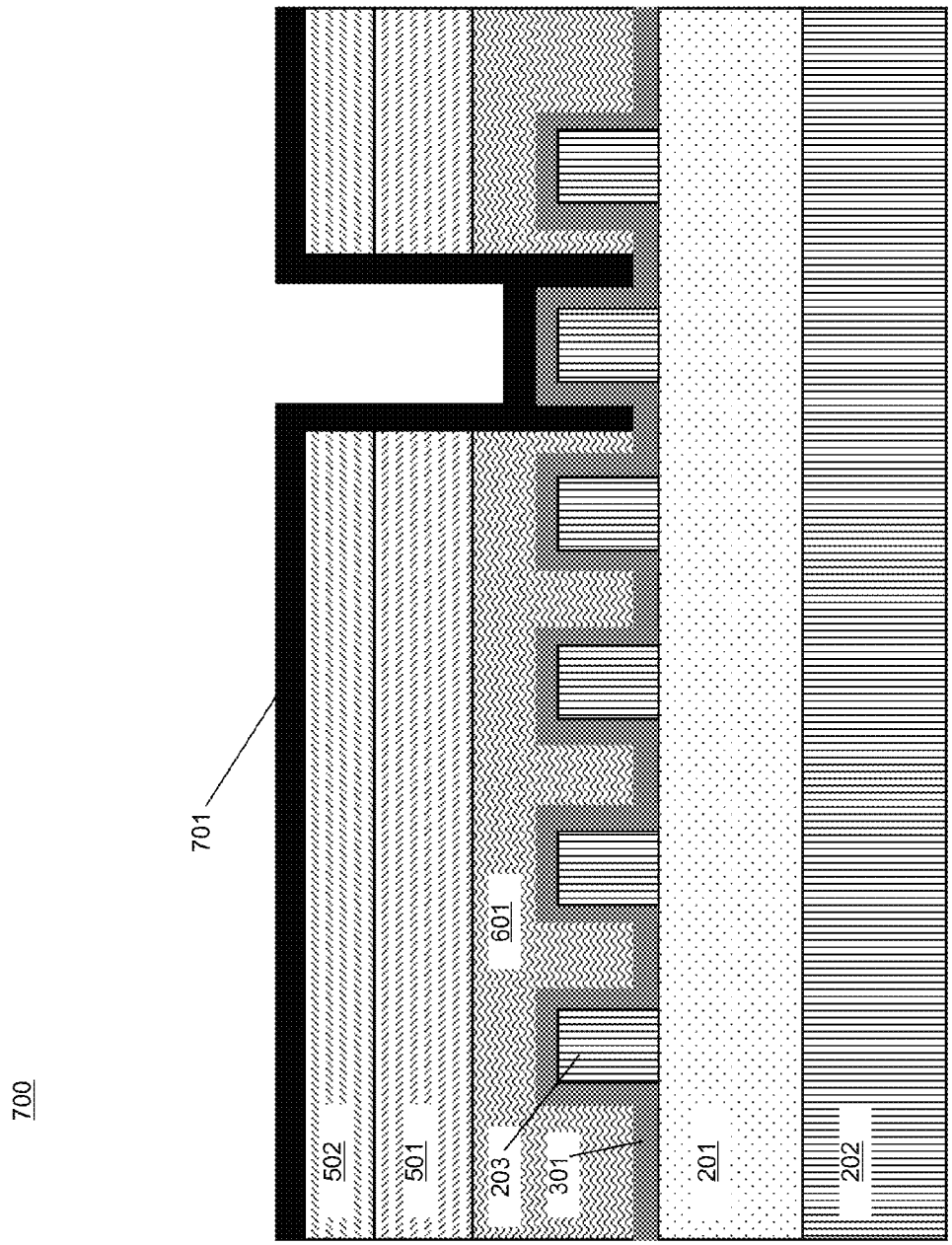
FIGS. 7A-C are schematic block diagrams respectively illustrating a cross-sections and a top view of an embodiment of the device of FIGS. 6A-B after formation of a spacer.
Figure 7B:
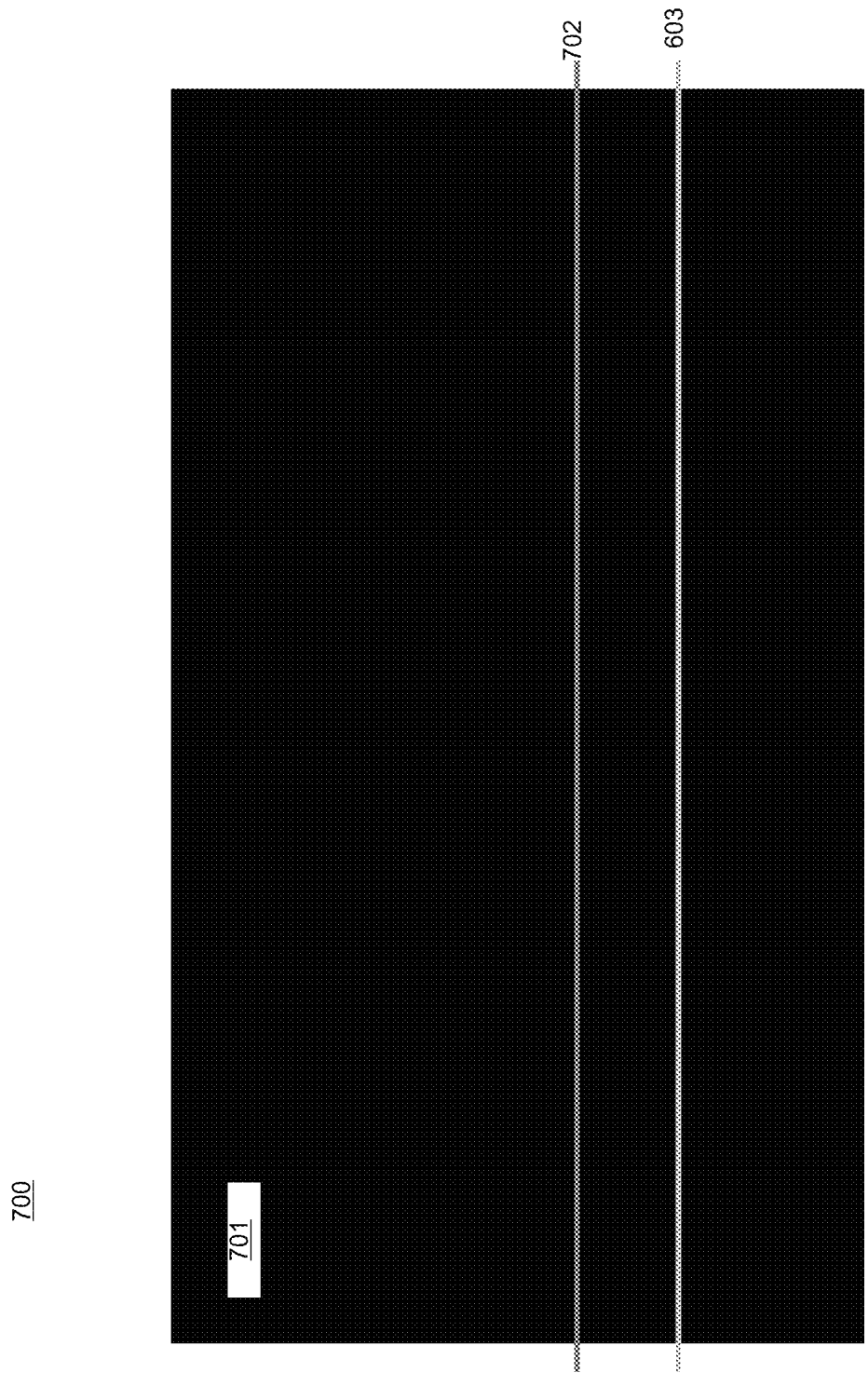
Figure 7C:
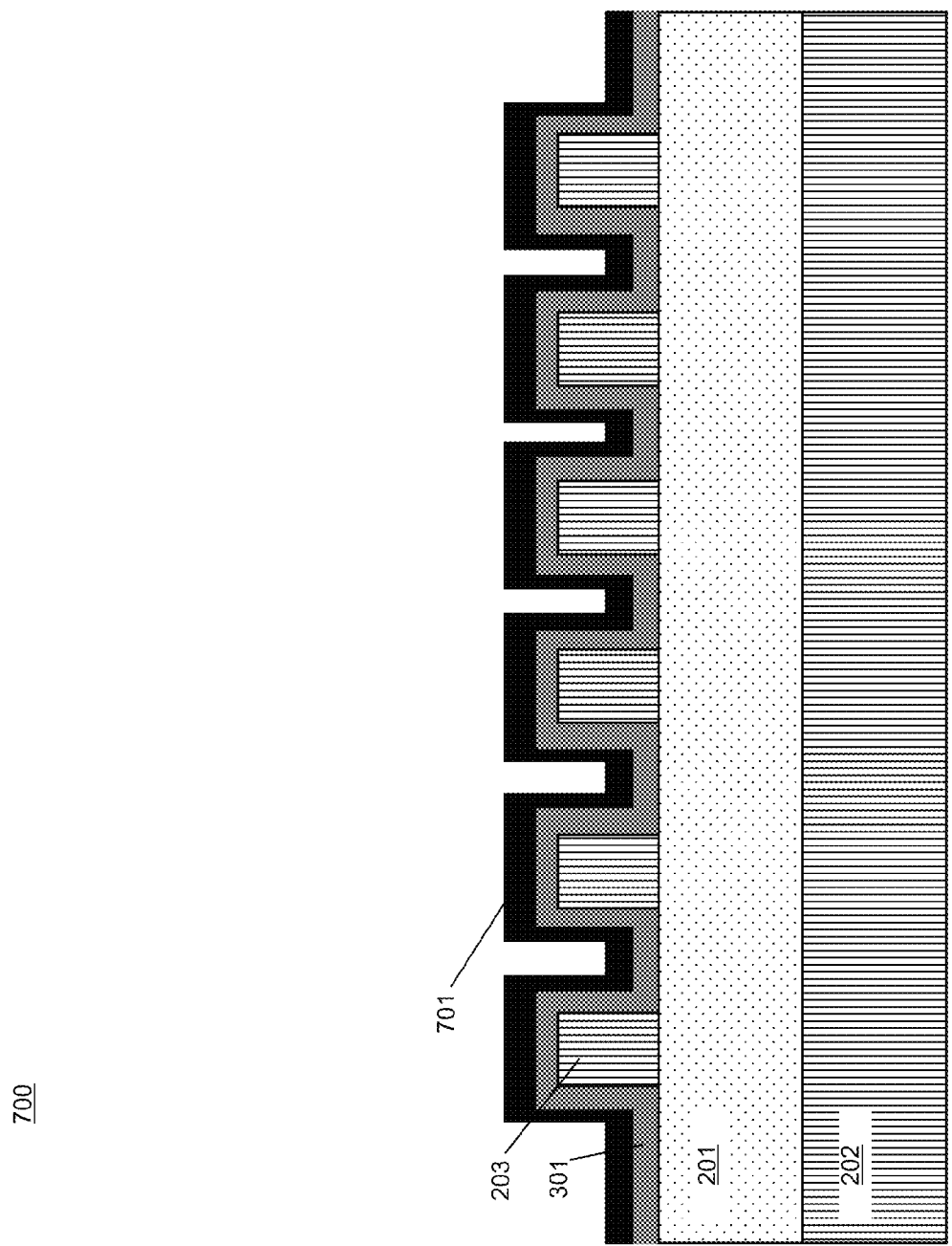

Next, in block 104 of method 100 of FIG. 1, a spacer is formed over the device, including the fins and gate regions. The spacer may comprise nitride, and may be deposited over the device by conformal deposition. FIGS. 7A and 7C illustrate cross-sections, and FIG. 7B illustrates a top view, of the device 600 of FIGS. 6A-B after formation of a spacer 701 over the device, including the gate regions 601 and fins 203. FIG. 7A shows a cross section of the device 700 across line 603 of FIG. 7B, which goes through one of the gate regions, while FIG. 7C shows a cross section of the device 700 across line 702 of FIG. 7B, which does not go through a gate region. Spacer 701 may comprise nitride.

Figure 8A:
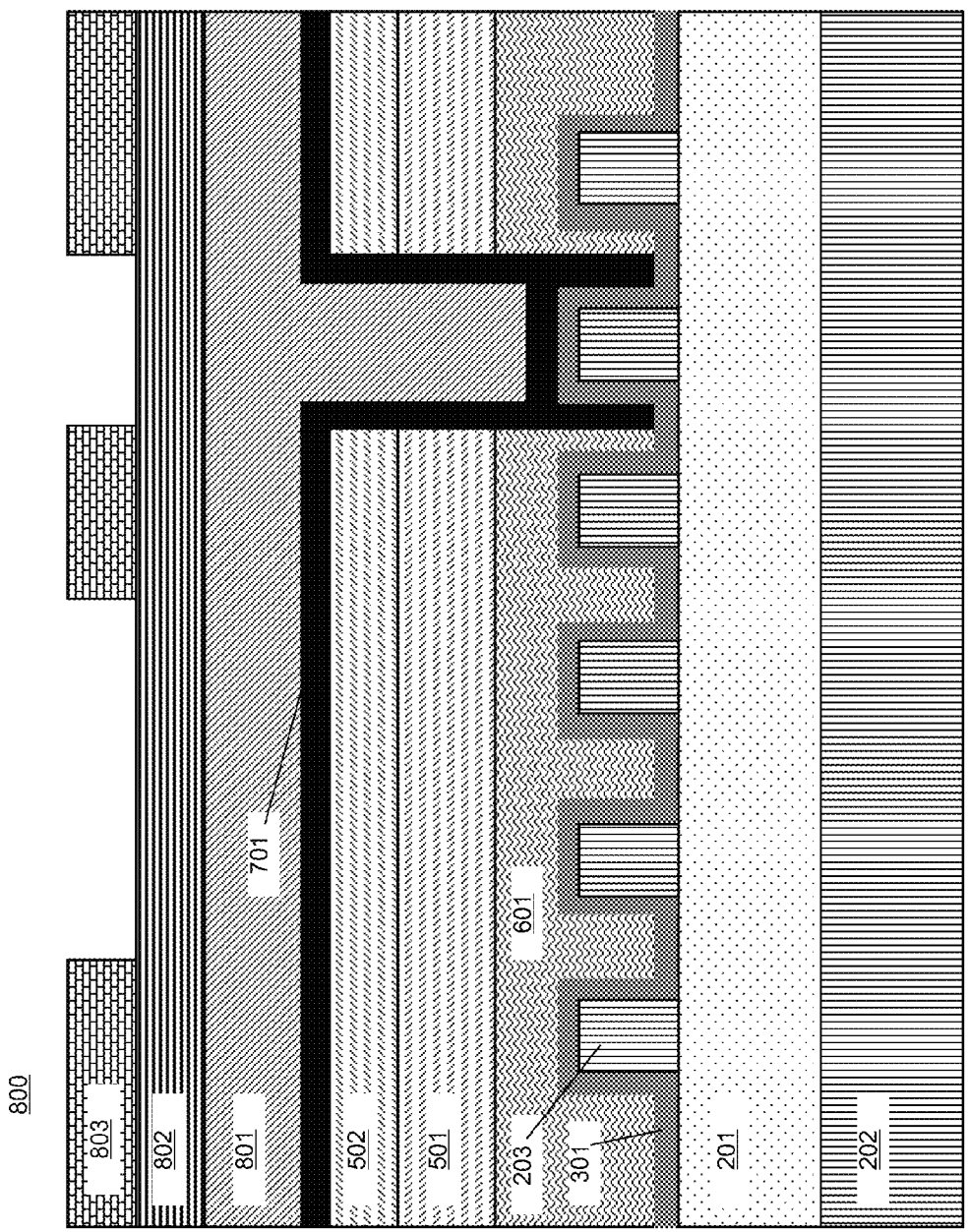
FIGS. 8A-C are schematic block diagrams respectively illustrating a cross-sections and a top view of an embodiment of the device of FIGS. 7A-B after formation of an isolation area mask.
Figure 8B:
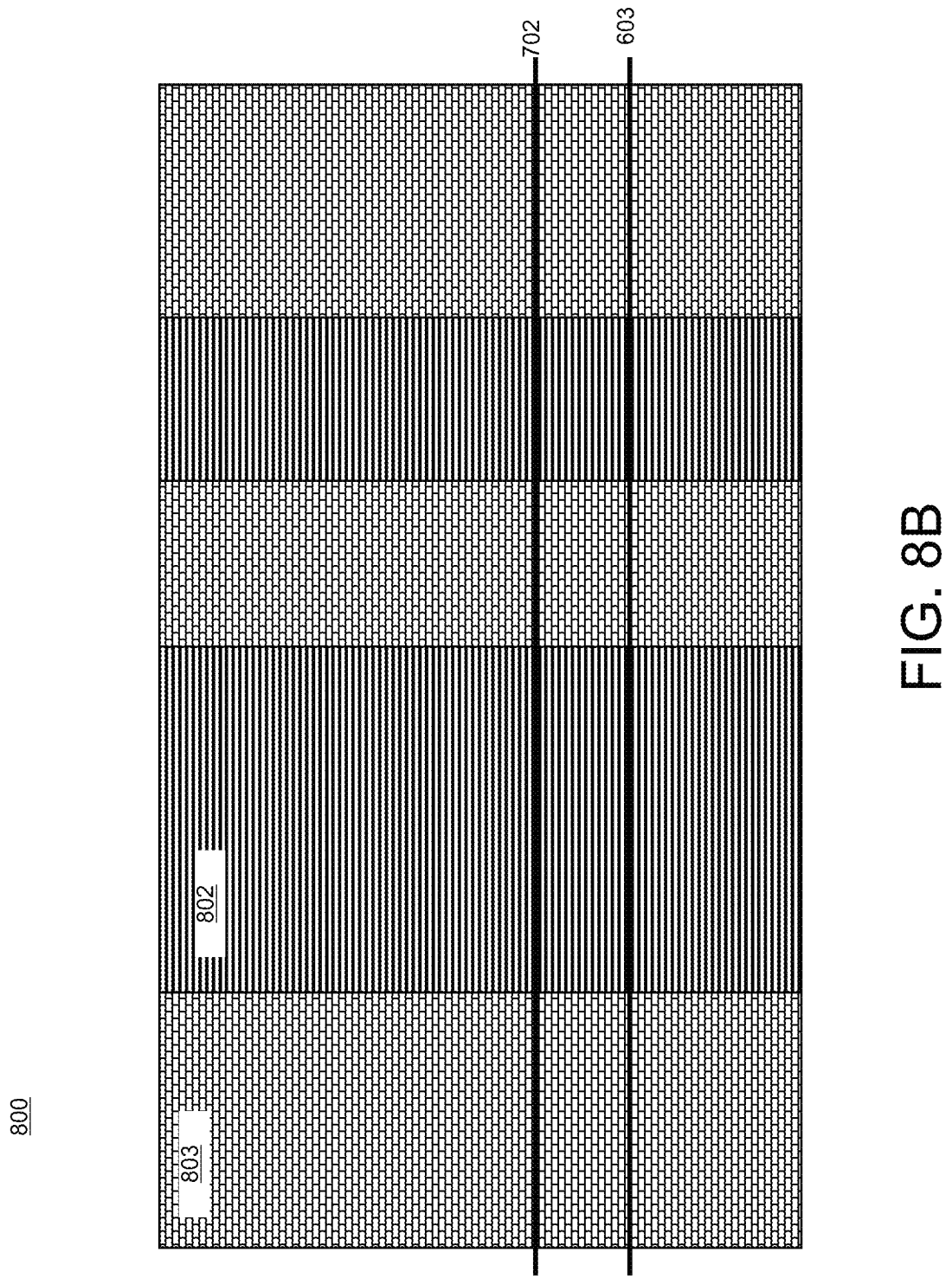
Figure 8C:
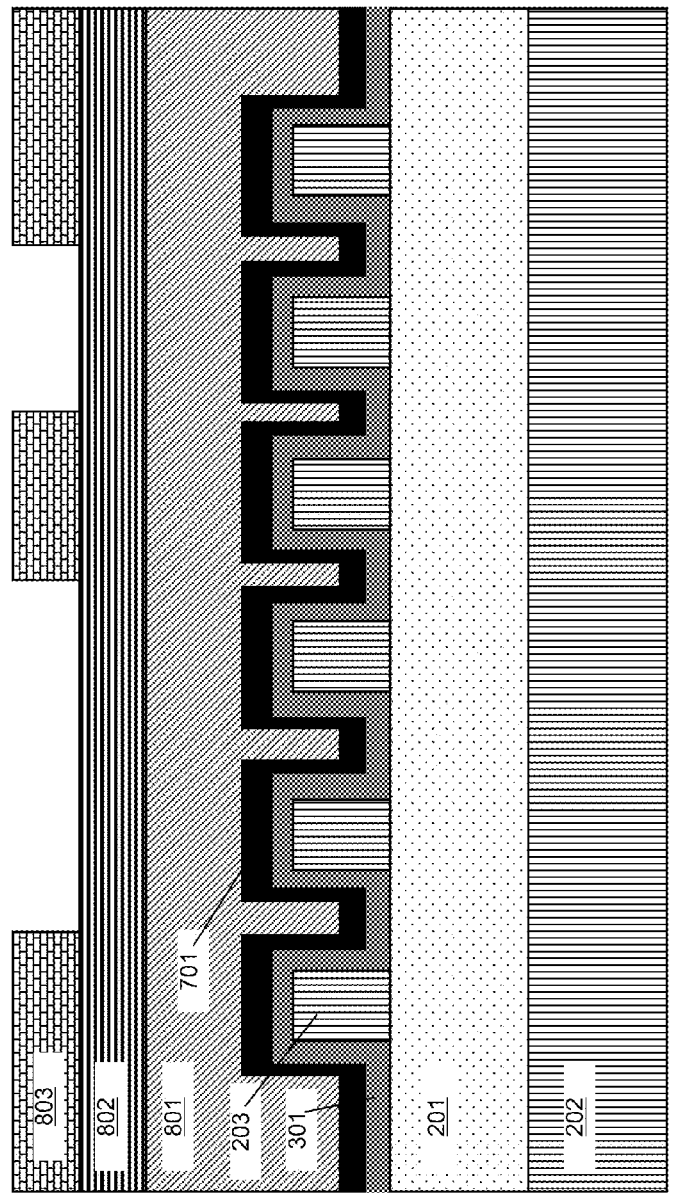

Flow of method 100 then proceeds to block 105, in which an isolation area mask is formed over the spacer. The isolation area mask defines the isolation areas for the finished finFET device, and may comprise a fin cut mask in some embodiments, or a fin oxidation mask in other embodiments. The isolation area mask may comprise an organic planarization layer (OPL) underneath a silicon anti-reflective coating (SiArc) layer underneath a photoresist layer that is patterned to define the isolation areas for the device. FIGS. 8A and 8C illustrate cross-sections, and FIG. 8B illustrates a top view, of the device 700 of FIGS. 7A-B after formation of an isolation area mask. FIG. 8A shows a cross section of the device 800 across line 603 of FIG. 8B, which goes through one of the gate regions, while FIG. 8C shows a cross section of the device 800 across line 702 of FIG. 8B, which does not go through a gate region. The isolation area mask comprises OPL 801, SiArc 802, and photoresist 803. The photoresist 803 is patterned such that the device isolation areas are exposed, and the active areas are covered.

Figure 9A:
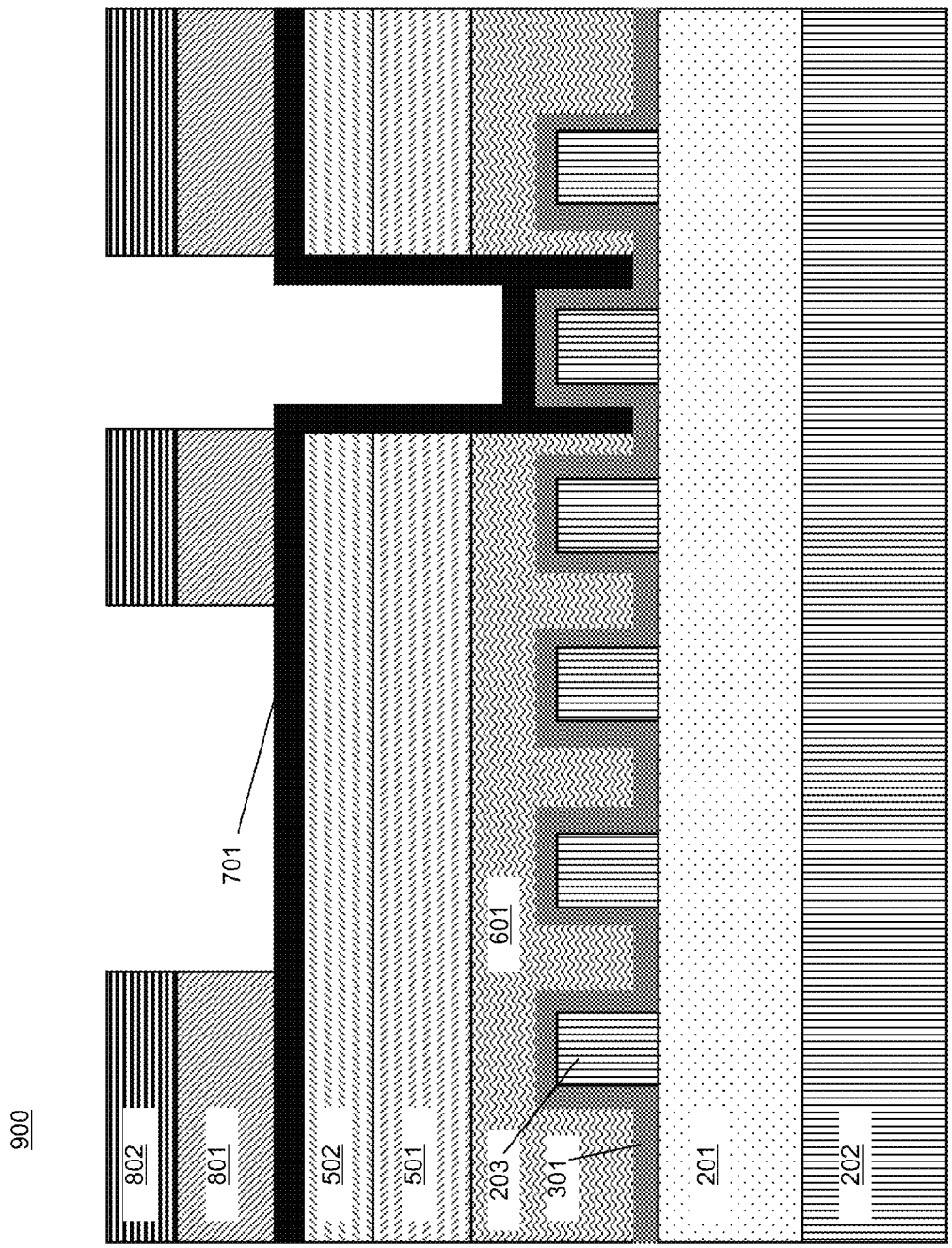
FIGS. 9A-C are schematic block diagrams respectively illustrating a cross-sections and a top view of an embodiment of the device of FIGS. 8A-B after etching to expose the spacer in the isolation areas using the isolation area mask.
Figure 9B:
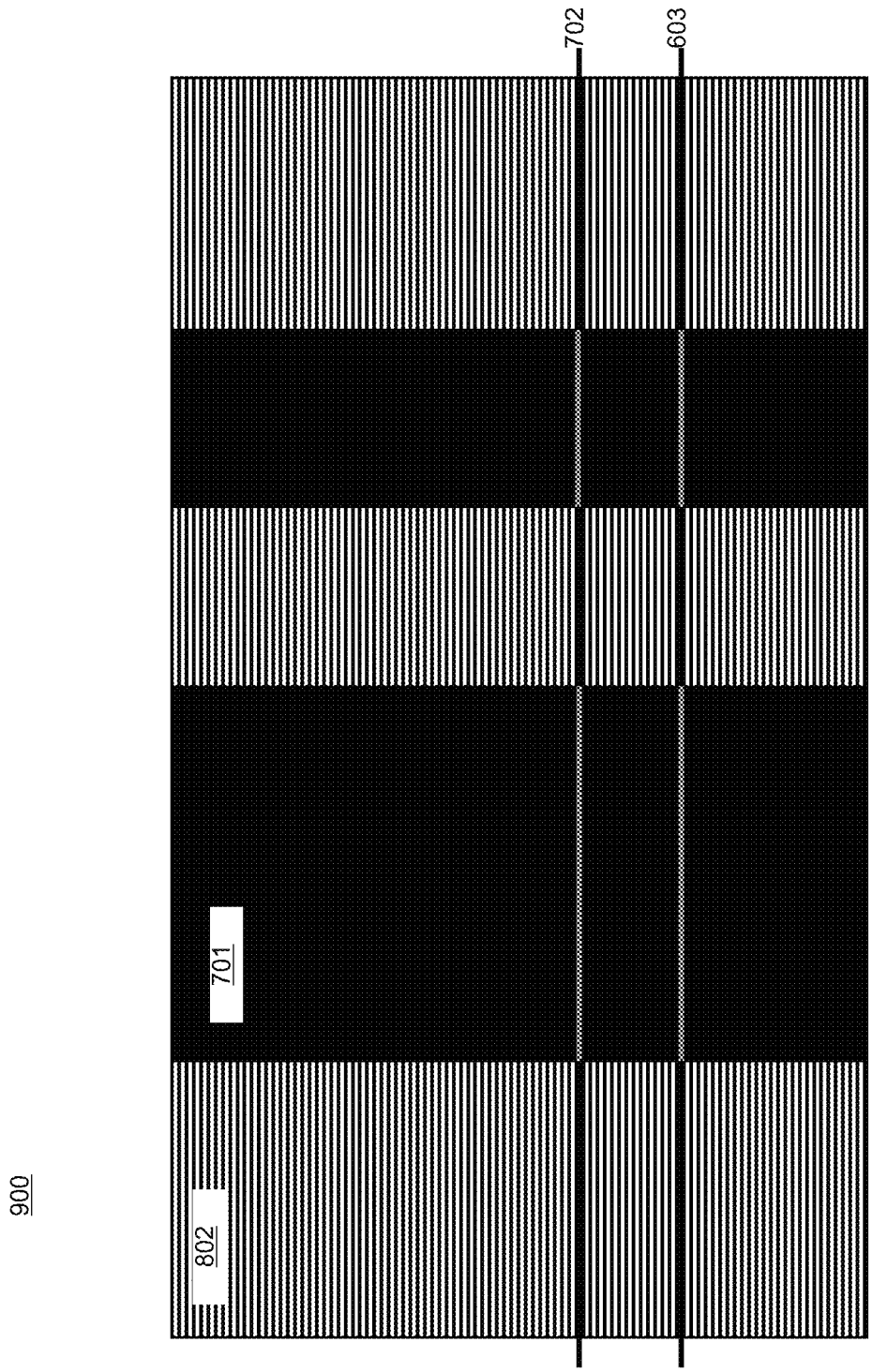
Figure 9C:
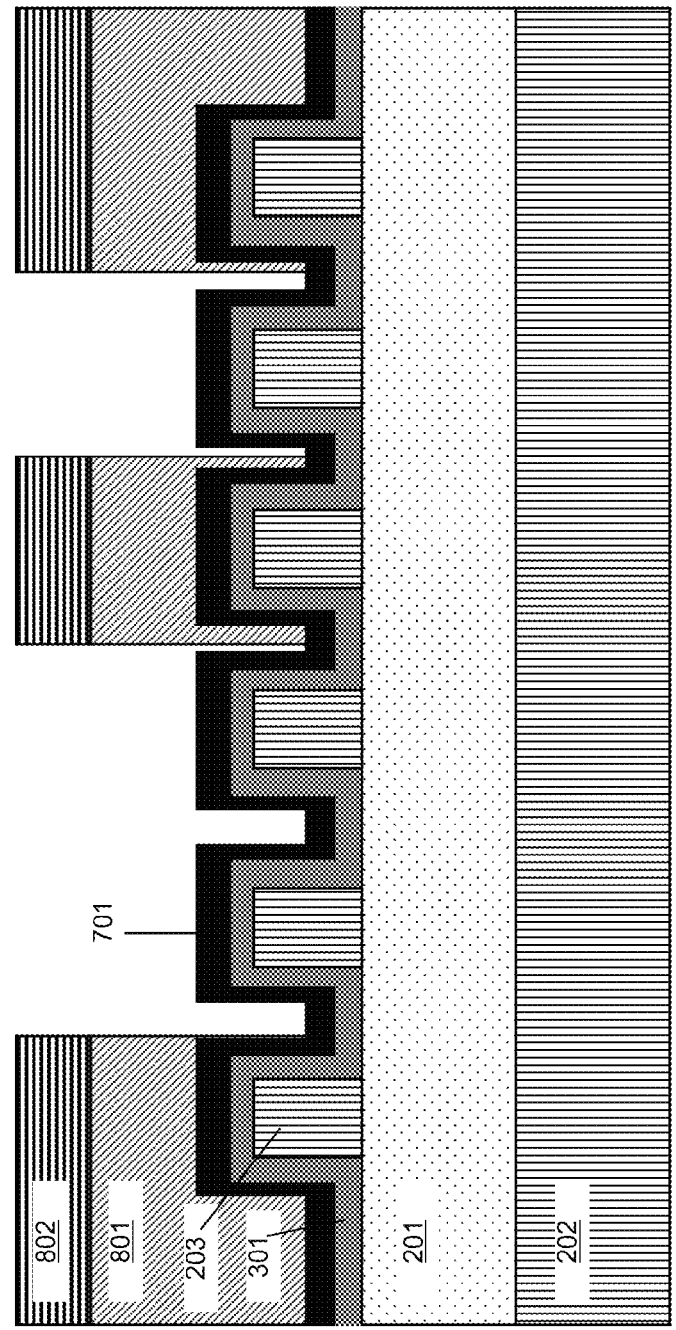
Figure 10A:
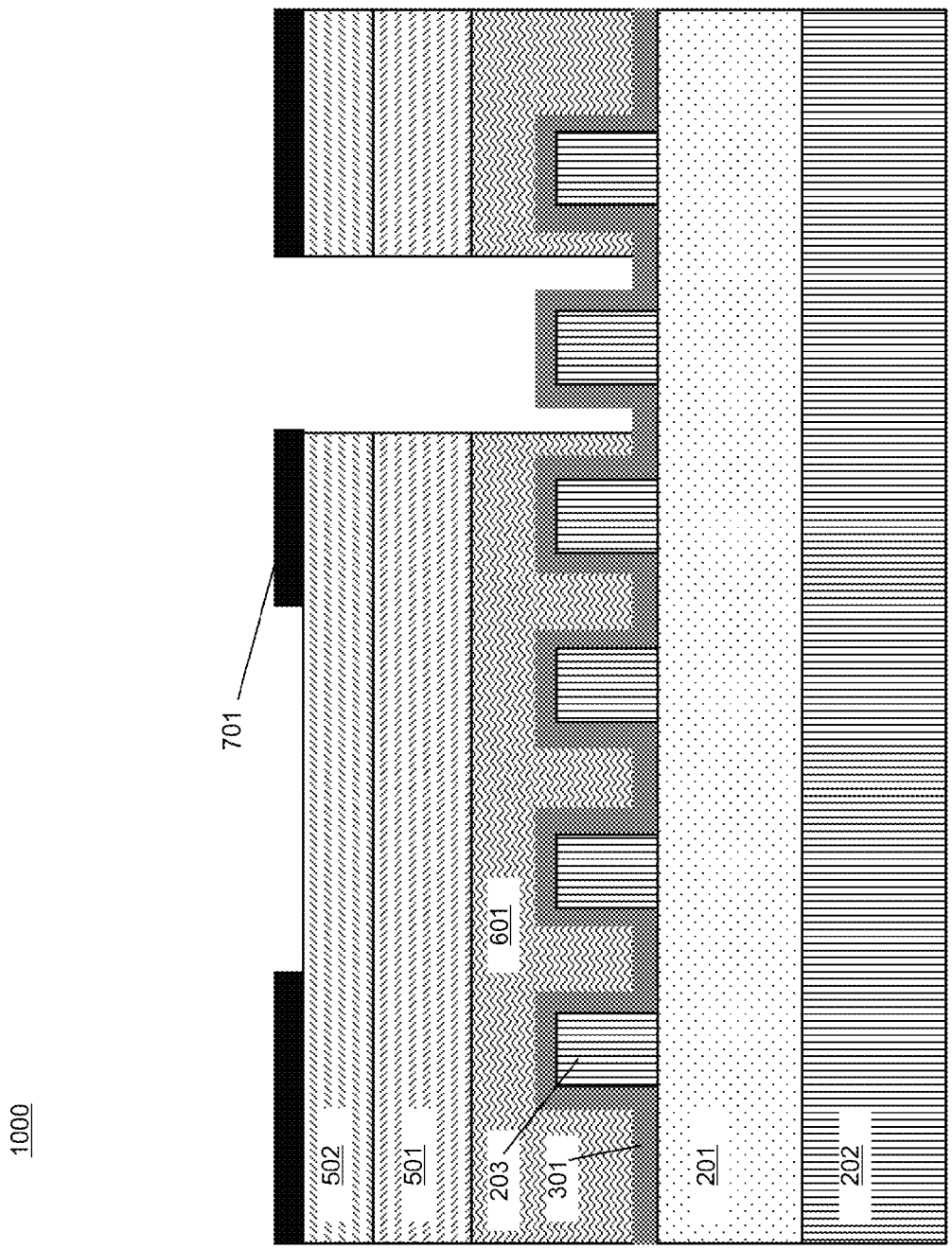
FIGS. 10A-C are schematic block diagrams respectively illustrating a cross-sections and a top view of an embodiment of the device of FIGS. 9A-B after removal of the spacer in the isolation areas.
Figure 10B:
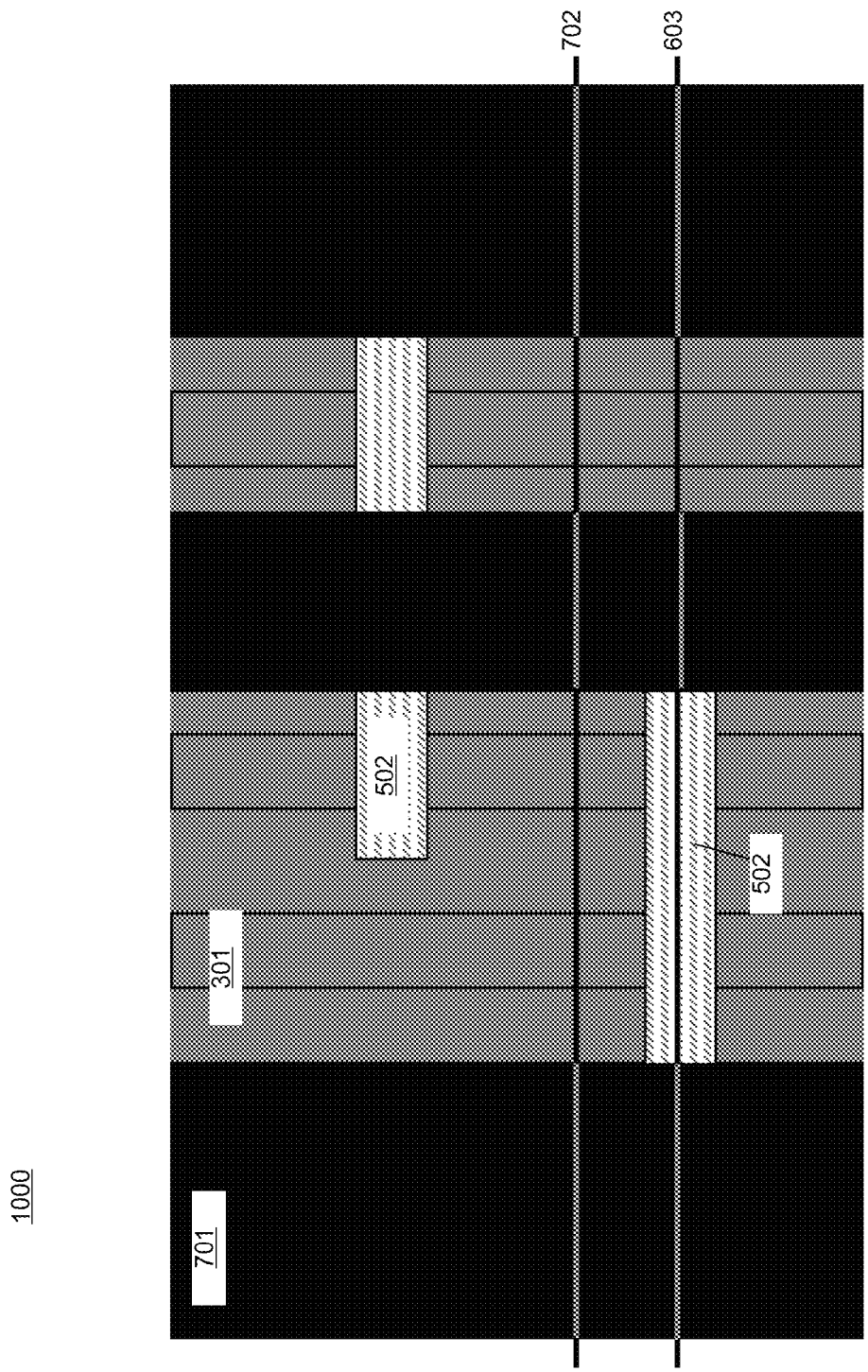
Figure 10C:
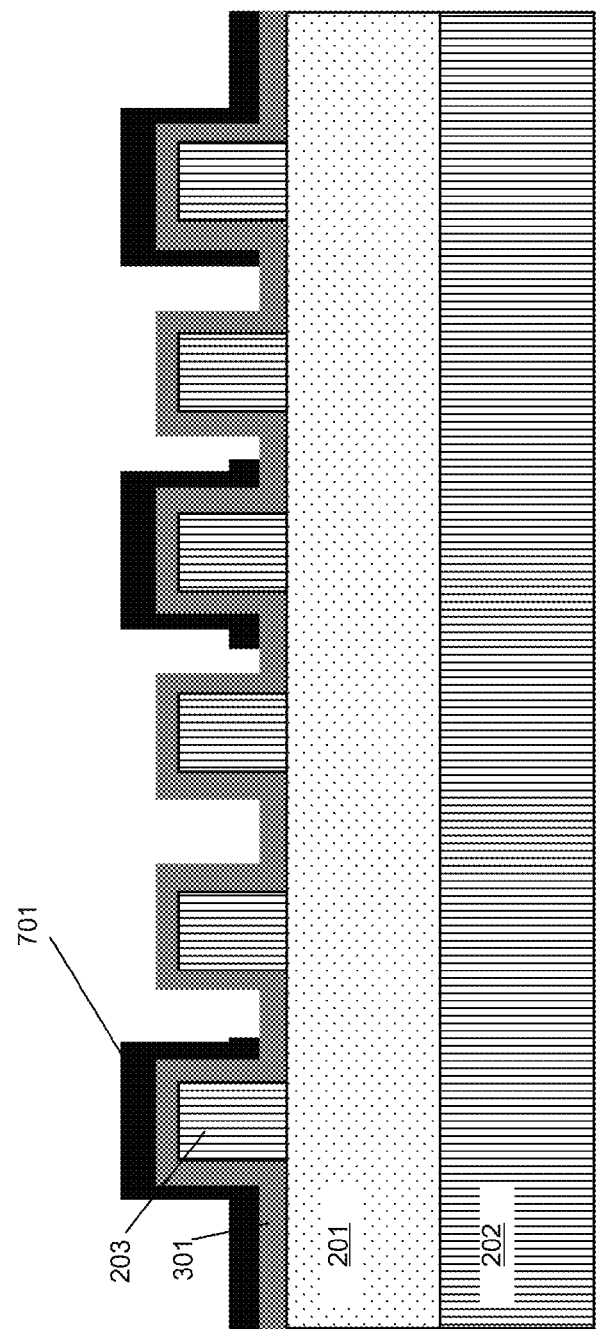

Returning to method 100 of FIG. 1, next, in block 106, the spacer is exposed and removed in the isolation areas using the isolation area mask. This may be performed in any appropriate manner; in some embodiments, exposing the spacer may comprise etching the pattern defined by the photoresist into the SiArc and the OPL (using, for example, reactive ion etching) and removing the photoresist. After the spacer is exposed, the exposed spacer material is removed. The spacer may comprise nitride, and removing the exposed spacer may comprise an etch that removes nitride selective to oxide. Removal of the nitride in the isolation areas exposes the dielectric layer that is located on the fins that are unwanted in the final finFET device. FIGS. 9A and 9C illustrate cross-sections, and FIG. 9B illustrates a top view, of the device 800 of FIGS. 8A-B after exposing the spacer 701 in the isolation areas using the isolation area mask. FIG. 9A shows a cross section of the device 900 across line 603 of FIG. 9B, which goes through one of the gate regions, while FIG. 9C shows a cross section of the device 900 across line 702 of FIG. 9B. As shown in FIGS. 9A-B, the OPL 801 and SiArc 802 have been etched down to expose the spacer 701 in the isolation areas, and the photoresist 803 has been removed. FIGS. 10A and 10C illustrate cross-sections, and FIG. 10B illustrates a top view, of the device 900 of FIGS. 9A-B after removal of the spacer in the isolation areas. FIG. 10A shows a cross section of the device 1000 across line 603 of FIG. 10B, which goes through one of the gate regions, while FIG. 10C shows a cross section of the device 1000 across line 702 of FIG. 10B, which does not go through a gate region. The OPL 801 and SiArc 802 have also been removed in FIGS. 10A-B. The spacer 701 may comprise nitride and the dielectric layer 301 may comprise oxide; therefore, removing the exposed spacer 701 may comprise an etch that removes nitride selective to oxide. Dielectric layer 301 is exposed in the isolation areas by the removal of spacer 701 in the isolation areas.

Figure 11A:
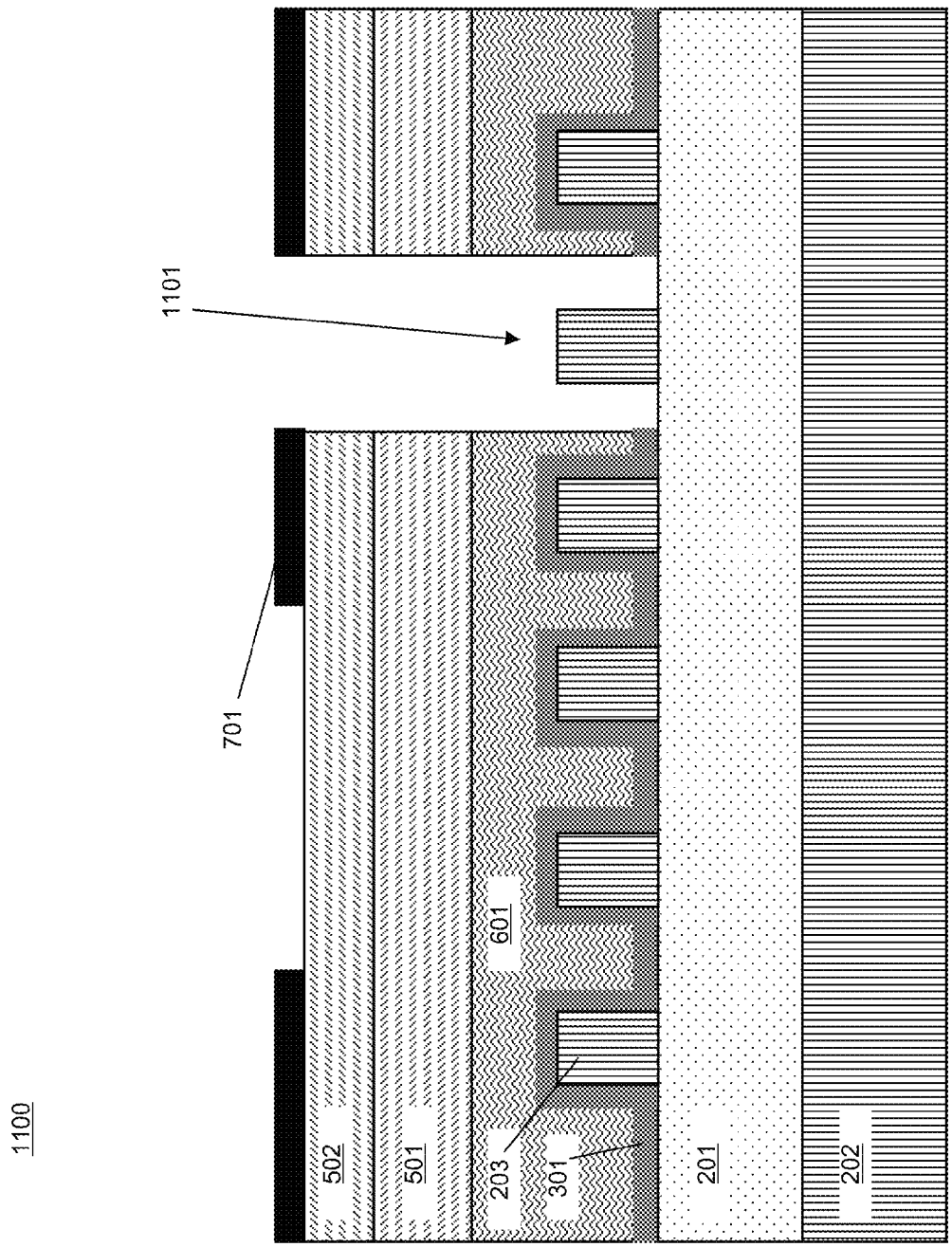
Figure 11B:
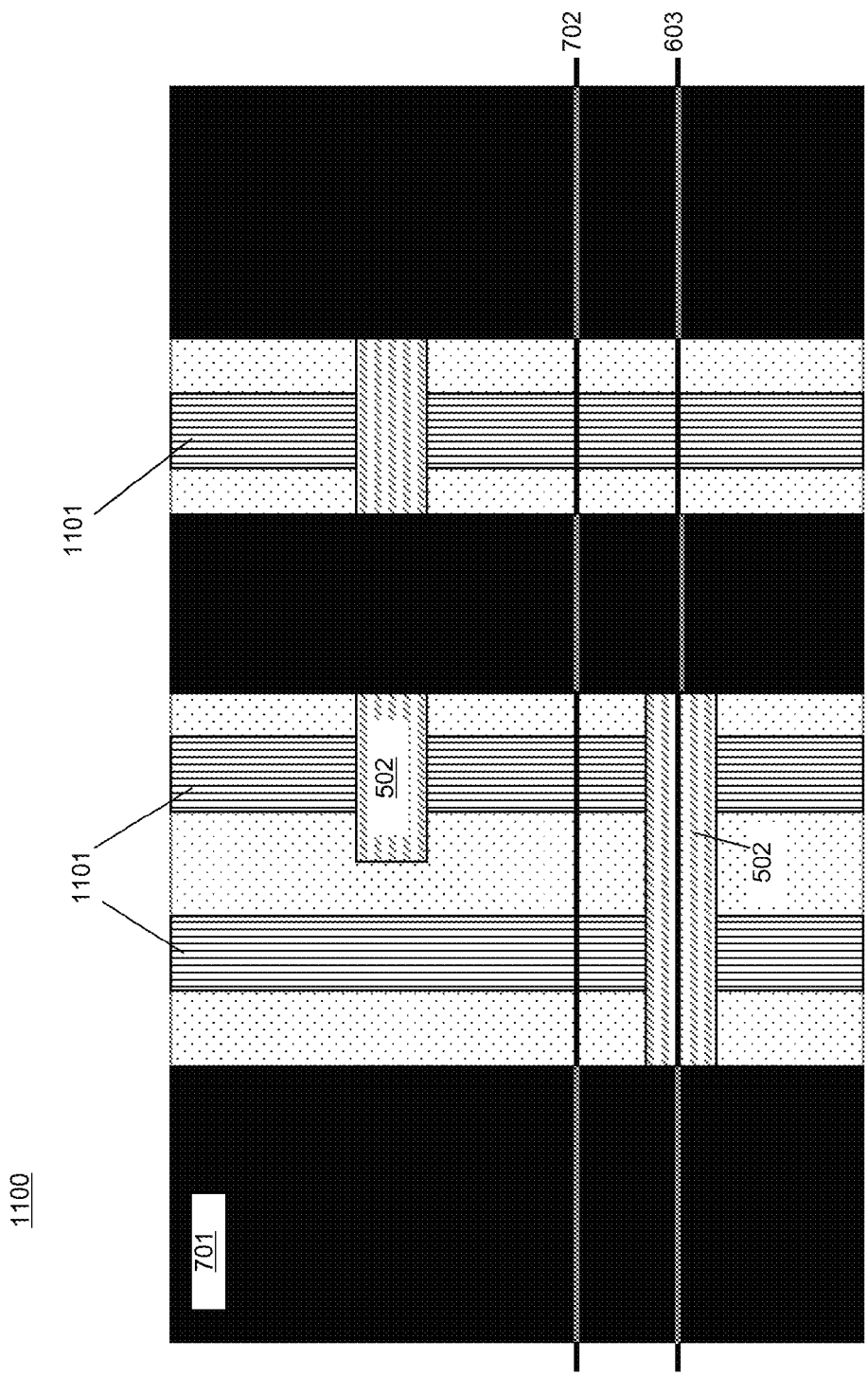

Flow of method 100 then proceeds to block 107, in which the exposed dielectric layer in the isolation areas is removed, thereby exposing any fins that are unwanted in the final fin-FET device. FIGS. 11A and 11C illustrate cross-sections, and FIG. 11B illustrates a top view, of device 1000 of FIGS. 10A-B after removal of the dielectric layer 301 in the isolation areas. FIG. 11A shows a cross section of the device 1100 across line 603 of FIG. 11B, which goes through one of the gate regions, while FIG. 11C shows a cross section of the device 1100 across line 702 of FIG. 11B, which does not go through a gate region. Unwanted fins, such as fins 1101 of fins 203, are exposed by removal of dielectric layer 301 in the isolation areas.

Figure 12A:
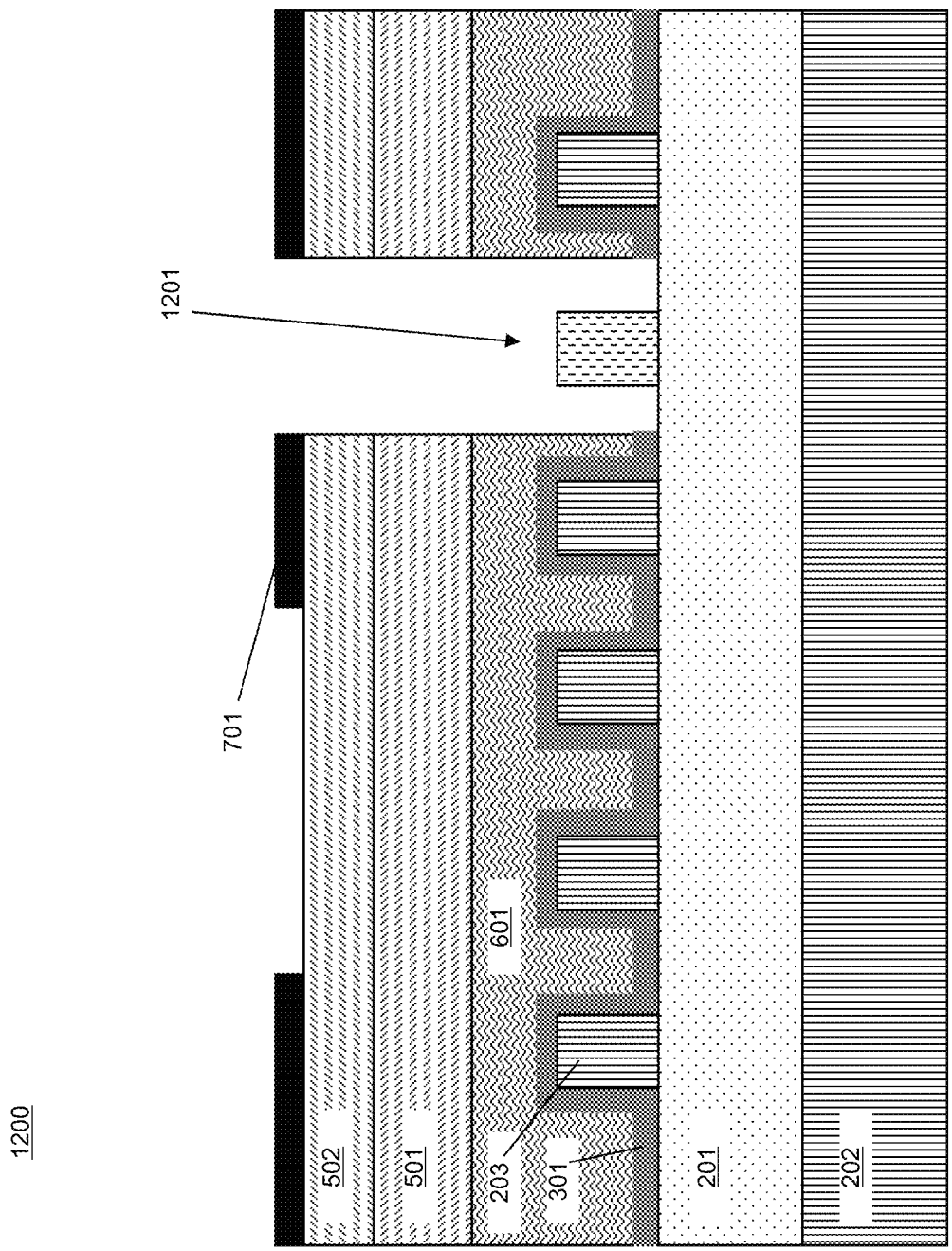
FIGS. 12A-C are schematic block diagrams respectively illustrating a cross-sections and a top view of an embodiment of the device of FIGS. 11A-B after oxidation of fins in the isolation areas.
Figure 12B:
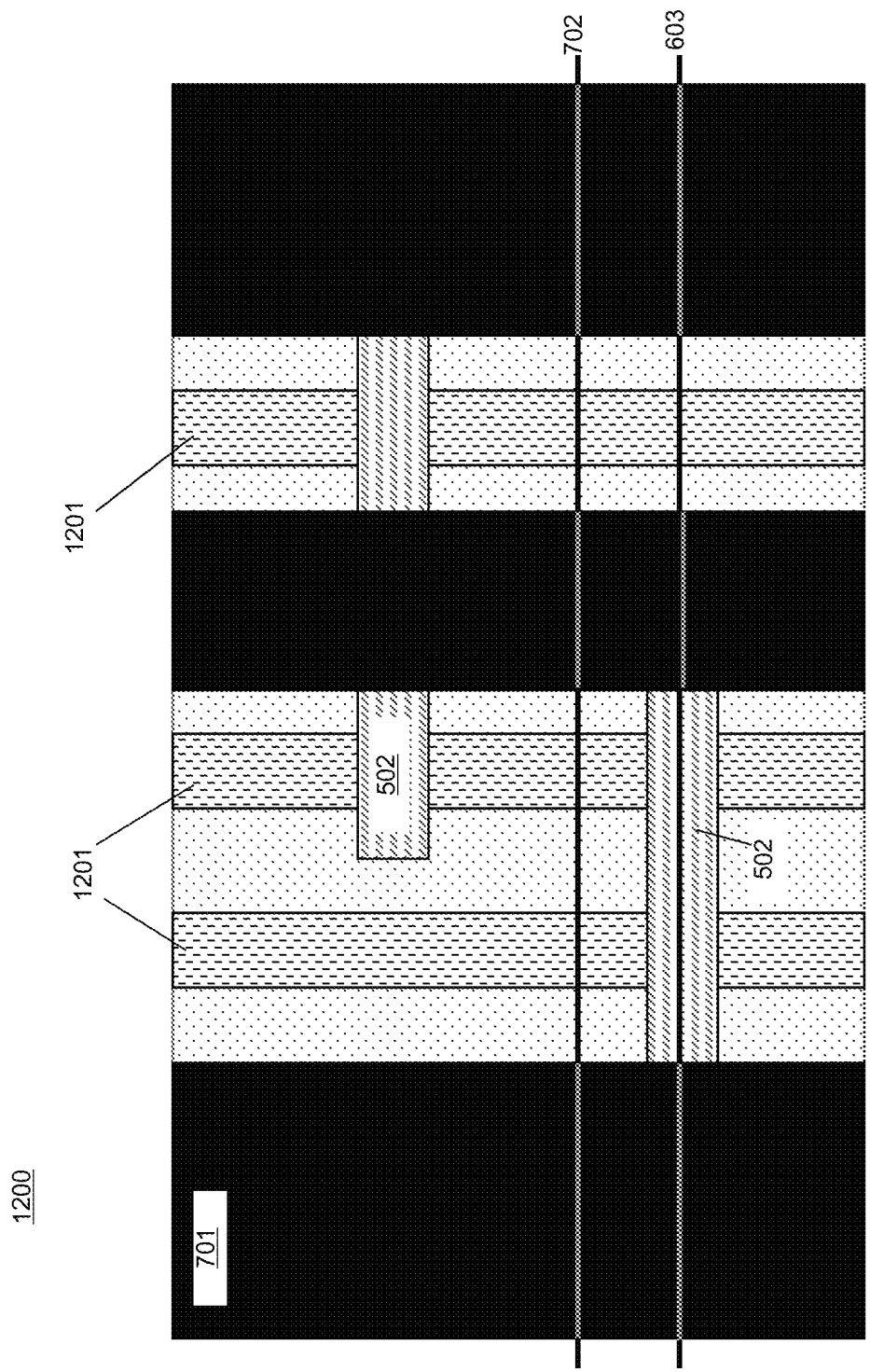
Figure 12C:
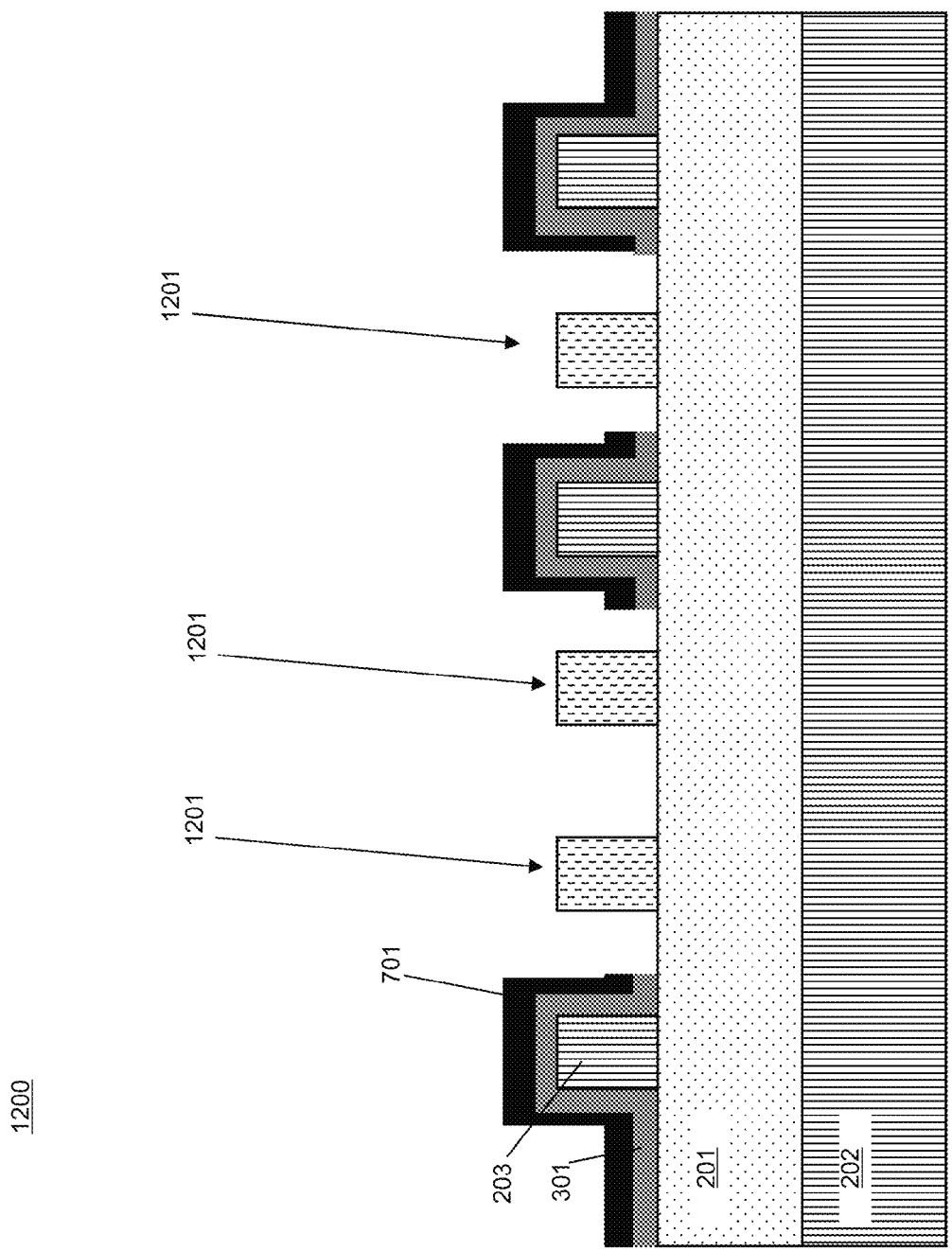

Next, in block 108 of method 100 of FIG. 1, the isolation areas for the final finFET device are formed. In some embodiments, the isolation areas may be formed by oxidizing the exposed fins. Fin oxidization may be used in conjunction with a gate-last process; i.e., in embodiments in which the gate regions comprise dummy gates. Fin oxidation may also be used in conjunction with a gate-first process, i.e., in embodiments in which the gate regions comprise final gates. However, in some embodiments of a gate-first process, oxidation of the fins may also oxidize materials that may be present in final gates. Therefore, in a gate-first process that includes fin oxidation, the oxidation of the gate material may be taken into account in the final device. Fin oxidation converts the silicon that comprises the fins to oxide. In other embodiments, the isolation areas may be formed by cutting the exposed fins. Fin cutting may be used in conjunction with either a gate-first or a gate-last process, and may comprise a chlorine-base dry etch that is selective to oxide in some embodiments. FIGS. 12A and 12C illustrate cross-sections, and FIG. 12B illustrates a top view, of the device 1100 of FIGS. 11A-B after oxidation of exposed fins, such as fins 1201, in the isolation areas. FIG. 12A shows a cross section of the device 1200 across line 603 of FIG. 12B, which goes through one of the gate regions, while FIG. 12C shows a cross section of the device 1200 across line 702 of FIG. 12B. Fins 1201 comprise oxide, and act as isolation areas in the final finFET device. The portions of the fins 1201 that are located underneath the gate regions 601 may not be oxidized, as shown in FIG. 12A.

Figure 13A:
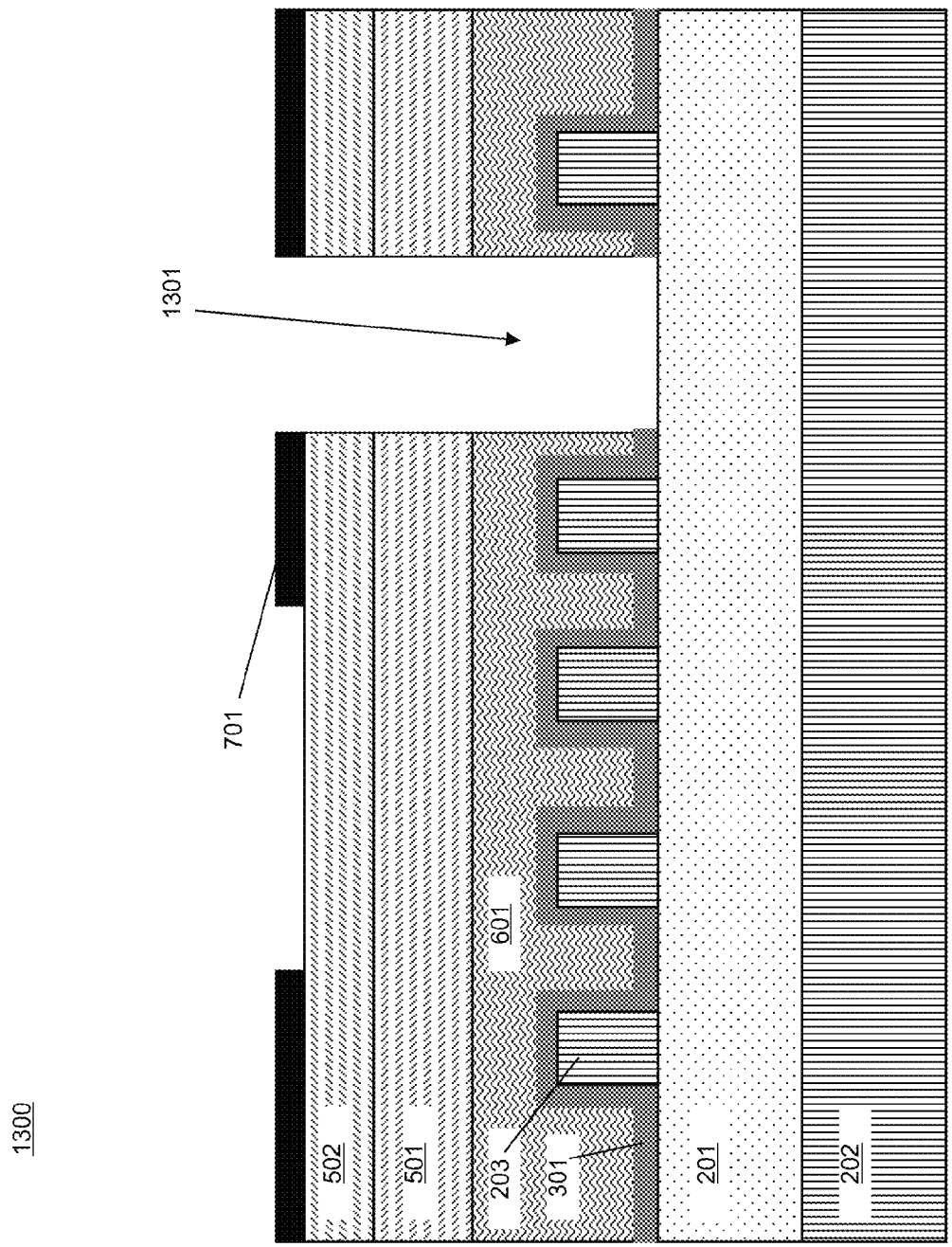
FIGS. 13A-C are schematic block diagrams respectively illustrating a cross-section and a top view of an embodiment of the device of FIGS. 11A-B after removal of fins in the isolation areas.
Figure 13B:
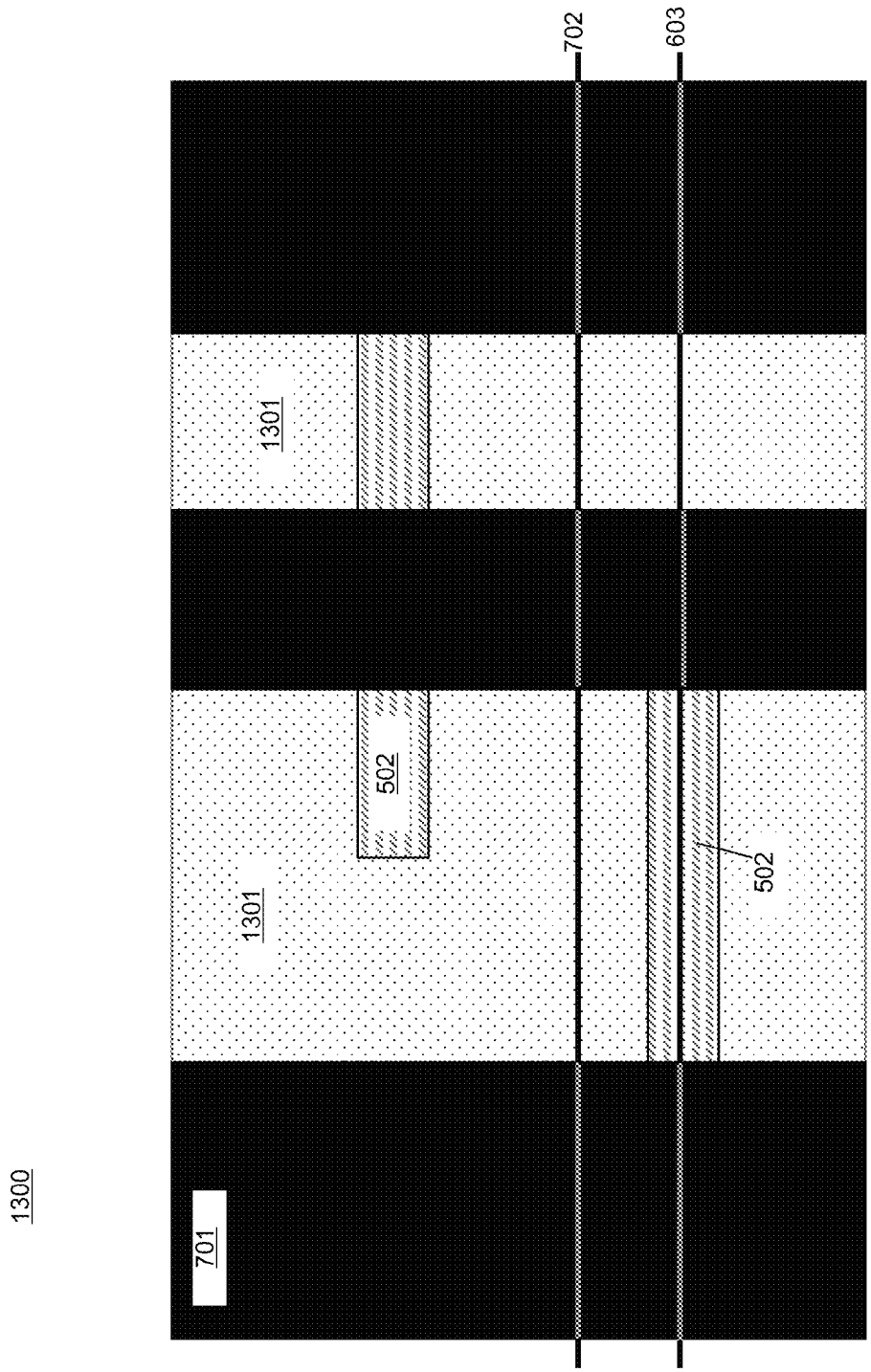
Figure 13C:
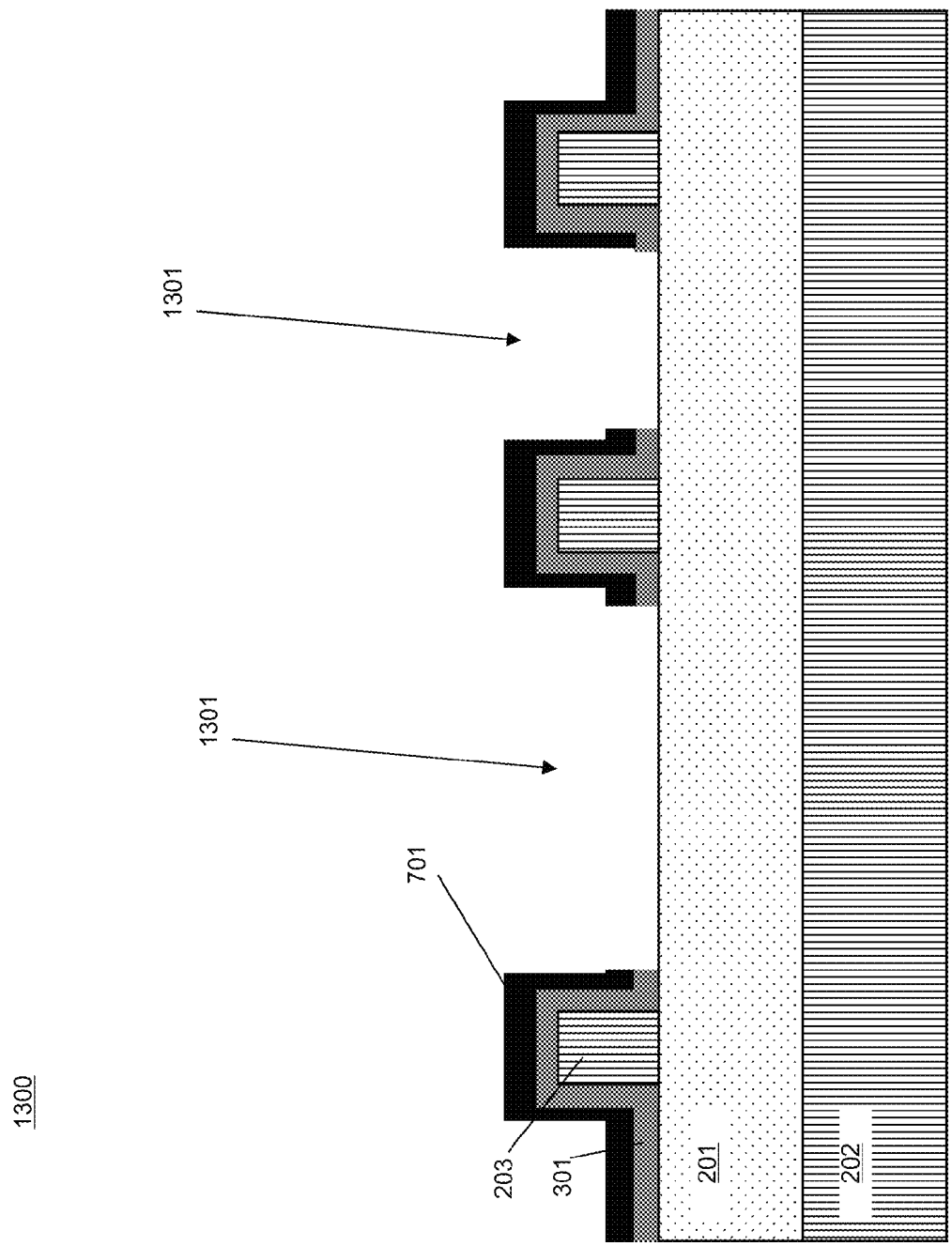

FIGS. 13A and 13C illustrate cross-sections, and FIG. 13B illustrates a top view, of the device of FIGS. 11A-B after removal of fins, such as fins 1101 that were shown in FIGS. 11A-B, to form the isolation areas 1301. FIG. 13A shows a cross section of the device 1300 across line 603 of FIG. 13B, which goes through one of the gate regions, while FIG. 13C shows a cross section of the device 1300 across line 702 of FIG. 13B. The portions of the fins 203 that are located underneath the gate regions 601 may not be removed, as shown in FIG. 13A.

Lastly in block 109 of method 100 of FIG. 1, the final finFET device is formed, including n-type and p-type source/drain regions. The n-type and p-type source/drain regions may be formed in any appropriate manner. In some embodiments, gate-last processing (i.e., removal and replacement of dummy gates with final gates) may also be performed in block 109. The resulting finished finFET device may have relatively low variation in topography across the device, which may allow formation of smaller and/or higher performance devices.

The technical effects and benefits of exemplary embodiments include reduction in topology variations that may negatively affect gate formation for a finFET device.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, and the practical application, and to enable others of ordinary skill in the art to understand the invention for various embodiments with various modifications as are suited to the particular use contemplated.

The invention claimed is:

1. A method for fin field effect transistor (finFET) device formation, the method comprising:
    forming a plurality of fins on a substrate;
    forming a gate region over the plurality of fins; and
    forming isolation areas for the finFET device after formation of the gate region, wherein forming the isolation areas for the finFET device comprises performing a removal of a subset of the plurality of fins.

2. The method of claim 1, wherein forming the isolation areas for the finFET device comprises performing oxidation of the subset of the plurality of fins.

3. The method of claim 1, wherein forming the isolation areas for the finFET device comprises performing removal of the subset of the plurality of fins.

4. The method of claim 1, wherein the substrate comprises a silicon-on-insulator (SOI) substrate comprising a bottom bulk substrate, a buried oxide (BOX) layer located on the bottom bulk substrate, and a top silicon layer locate on the BOX layer, and wherein the plurality of fins are formed in the top silicon layer of the SOI substrate.

5. The method of claim 1, further comprising depositing a dielectric layer over the plurality of fins before forming the gate region, wherein the gate region is formed on the dielectric layer.

6. The method of claim 5, wherein the dielectric layer comprises oxide, and wherein depositing the dielectric layer comprises conformal atomic layer deposition.

7. The method of claim 5, wherein forming the gate region over the plurality of fins comprises:
    depositing a gate material over the dielectric layer;
    planarizing a top surface of the gate material;
    depositing a two-layer mask comprising a bottom mask layer and a top hardmask layer over the gate material; and
    etching the gate material to form the gate region, wherein the two-layer mask remains on top of the gate region after etching to form the gate region.

8. The method of claim 7, wherein the bottom mask layer comprises nitride, and the top hardmask layer comprises oxide.

9. The method of claim 7, wherein the bottom mask layer comprises nitride, and the top hardmask layer comprises nitride.

10. The method of claim 7, wherein the gate region comprises a dummy gate, and wherein the gate material comprises polysilicon.

11. The method of claim 7, wherein the gate region comprises a final gate, and wherein the gate material comprises a silicon layer over a metal layer.

12. The method of claim 1, further comprising forming a nitride spacer over the gate region and over a dielectric layer that is located on the plurality of fins before forming the isolation areas.

13. The method of claim 12, wherein forming isolation areas for the finFET device after formation of the gate region comprises:
    forming an isolation area mask over the nitride spacer;
    removing the nitride spacer in the isolation areas to expose the subset of the plurality of fins using the isolation area mask; and
    performing one of oxidation and removal of the exposed subset of the plurality of fins to form the isolation areas.

14. The method of claim 13, wherein the gate region comprises a dummy gate, and wherein forming the isolation areas comprises oxidation.

15. The method of claim 13, wherein the gate region comprises a final gate, and wherein forming the isolation areas comprises oxidation.

16. The method of claim 13, wherein the gate region comprises a dummy gate, and wherein forming the isolation areas comprises removal.

17. The method of claim 13, wherein the gate region comprises a final gate, and wherein forming the isolation areas comprises removal.

18. The method of claim 13, further comprising removing the dielectric layer from the exposed subset of the plurality of fins before performing one of oxidation or removal of the exposed subset of the plurality of fins.

19. The method of claim 14, wherein the isolation area mask comprises:
    an organic planarization layer (OPL) located on top of the nitride spacer;
    a silicon anti-reflective coating (SiArc) layer located over the OPL; and
    a photoresist layer located on top of the OPL.

20. The method of claim 19, wherein the photoresist layer is located on top of an active region of the finFET device, and exposes the isolation areas.

* * * * *